United States Patent [19]
Sada

[11] Patent Number: 6,129,546
[45] Date of Patent: Oct. 10, 2000

[54] HEAT PROCESS APPARATUS AND HEAT PROCESS METHOD

[75] Inventor: Tetsuya Sada, Ozu-machi, Japan

[73] Assignee: Tokyo Electron Limited, Tokyo, Japan

[21] Appl. No.: 09/338,231

[22] Filed: Jun. 22, 1999

[30]  Foreign Application Priority Data

Jun. 25, 1998 [JP] Japan .................................. 10-179114

[51] Int. Cl.$^7$ ...................................................... F27D 5/00
[52] U.S. Cl. ...................... 432/253; 432/231; 118/725; 118/728
[58] Field of Search ............................. 432/33, 159, 225, 432/227, 231, 253, 258; 414/939; 118/724, 725, 728; 219/405, 411; 392/418; 204/298.15; 156/345; 269/21

[56]  References Cited

U.S. PATENT DOCUMENTS

| | | | |
|---|---|---|---|
| 5,462,603 | 10/1995 | Murakami | 118/724 |
| 5,569,350 | 10/1996 | Osada et al. | 118/728 |
| 5,738,165 | 4/1998 | Imai | 118/728 |
| 5,792,304 | 8/1998 | Tamura et al. | 118/724 |
| 5,803,977 | 9/1998 | Tepman et al. | 118/728 |
| 5,817,156 | 10/1998 | Tateyama et al. | |

FOREIGN PATENT DOCUMENTS 3-135011   6/1991   Japan .
5-047652   2/1993   Japan .

*Primary Examiner*—Denise L. Ferensic
*Assistant Examiner*—Gregory A. Wilson
*Attorney, Agent, or Firm*—Morrison & Foerster

[57]  ABSTRACT

Pins that are small protrusions are disposed on the upper surface of a heat process board. Through-holes are formed between the pins so as to deaerate from a space thereof. In a predetermined time period in the initial stage of the heat process, a deaerating process is performed using the through-holes. Thus, a negative pressure is applied to the space between the lower surface of the substrate and the upper surface of the heat process board so as to contact the substrate and the heat process board. Thereafter, the vacuum degree is lowered. Due to the rigidity of the substrate, the substrate and the heat process board are separated. In the initial stage of the heat process, since the substrate and the heat process board directly contact, the temperature of the substrate quickly and equally rises. In addition, when the heat shrinkage is large, since the substrate and the heat process board are separated, static electricity due to friction hardly takes place. Thus, a static breakdown can be prevented. Consequently, a heat process apparatus and a heat process method that allow the entire substrate to be heat-processed are provided.

15 Claims, 21 Drawing Sheets

HEAT PROCESS APPARATUS AND HEAT PROCESS METHOD

FIELD OF THE INVENTION

The present invention relates to a heat process apparatus (such as a heating apparatus and a cooling apparatus) and a heat process method for use with an LCD fabricating system that fabricates a liquid crystal display device (hereinafter referred to as LCD) using for example a photomechanical technology.

BACKGROUND OF THE INVENTION

As a conventional heat process apparatus that performs a heat process for an LCD glass substrate (hereinafter referred to as glass substrate), a direct-contact-type heat process apparatus has been used. In the apparatus, a glass substrate is vacuum-sucked on the upper surface of a heat process board having a heater, a cooling member, or the like. Thus, the lower surface of the glass substrate and the upper surface of the heat process board are contacted. In this state, heat directly transfers from the heat process board to the glass substrate.

In the direct-contract-type heat process apparatus, since heat of the heat process board directly transfers to a glass substrate as a workpiece, the heat transfer efficiency is high. Thus, the glass substrate can be equally heat-processed in a short time.

However, in the direct-contact-type heat process apparatus, friction tends to take place between the glass substrate and the heat process board. The friction causes static electricity to be stored in the glass substrate. When the amount of the static electricity exceeds a predetermined value, a static breakdown takes place. Since the voltage of the static breakdown is as high as several ten kilovolts, it remarkably damages the glass substrate. Thus, the static breakdown is one of major causes that deteriorate the yield of the LCD fabrication. Consequently, it is important to prevent the static breakdown.

As a method for preventing the static breakdown, a non-contact-type heat process method is known. In the non-contact-type heat process method, many small protrusions are disposed on the upper surface of a heat process board. Thus, when a glass substrate is placed on the heat process board, the lower surface of the glass substrate only contacts edge portions of the protrusions. Thus, most portions of the glass substrate are spaced apart from the upper surface of the heat process board. Heat of the heat process board transfers through air in a small space formed between the upper surface of the heat process board and the lower surface of the glass substrate.

In the non-contact-type heat process apparatus, since static electricity due to friction is suppressed, the glass substrate is less damaged by the static breakdown.

However, in the non-contact-type heat process apparatus, since heat indirectly transfers to the glass substrate through air, it takes a time to transfer heat to the glass substrate. In addition, since heat does not equally transfer to the glass substrate, the heat process cannot be equally performed.

SUMMARY OF THE INVENTION

The present invention is made from the above-described point of view.

In other words, an object of the present invention is to provide a heat process apparatus and a heat process method that are free of static breakdown.

Another object of the present invention is to provide a heat process apparatus and a heat process method that equally perform a heat process for an entire glass substrate.

A further object of the present invention is to provide a heat process apparatus and a heat process method that quickly perform a heat process.

To solve the above-described problem, a first aspect of the present invention is a heat process apparatus, comprising a heat process board for heating a substrate as a workpiece, a plurality of supporting members, disposed on a substrate mounting side of the heat process board, for supporting the substrate with a predetermined distance against the heat process board, and a sucking means, disposed in a non-supporting area of the supporting members, for sucking the substrate toward the heat process board.

A sucking area of the sucking means against the substrate is preferably composed of a plurality of areas and/or at least a part of a peripheral portion of the substrate.

The plurality of supporting members or transferring means are preferably disposed at positions forming a rhombus shape connecting the center point of each side of the substrate placed on the heat process board and/or at positions of four corners and the center point of each side of the substrate placed on the heat process board.

The heat process apparatus further comprises a sucking amount adjusting means for adjusting the sucking amount of the sucking means. The sucking amount adjusting means preferably causes the substrate to contact the heat process board or separate from the heat process board by a predetermined distance.

The distance between a peripheral portion of the substrate and the heat process board is preferably larger than the distance between a center portion of the substrate and the heat process board.

A predetermined voltage is preferably applied to the plurality of supporting members or transferring means.

The distance between the substrate and the heat process board separated by the supporting members or the transferring means is preferably in the range from 0.2 to 0.3 mm.

A second aspect of the present invention is a heat process apparatus, comprising a heat process board for heating a substrate as a workpiece, a transferring means for supporting the substrate at a plurality of points so as to contact and/or separate the heat process board and the substrate, and a sucking means for sucking the substrate toward the heat process board in the state that the substrate is being supported by the conveying means.

A sucking area of the sucking means against the substrate is preferably composed of a plurality of areas and/or at least a part of a peripheral portion of the substrate.

The plurality of supporting members or transferring means are preferably disposed at positions forming a rhombus shape connecting the center point of each side of the substrate placed on the heat process board and/or at positions of four corners and the center point of each side of the substrate placed on the heat process board.

The heat process apparatus further comprises a sucking amount adjusting means for adjusting the sucking amount of the sucking means. The sucking amount adjusting means preferably causes the substrate to contact the heat process board or separate from the heat process board by a predetermined distance.

The distance between a peripheral portion of the substrate and the heat process board is preferably larger than the distance between a center portion of the substrate and the heat process board.

A predetermined voltage is preferably applied to the plurality of supporting members or transferring means.

The distance between the substrate and the heat process board separated by the supporting members or the transferring means is preferably in the range from 0.2 to 0.3 mm.

A third aspect of the present invention is a heat process method, comprising the steps of approaching a substrate as a workpiece to a heat process board in a predetermined distance, and causing the distance between a peripheral portion of the substrate and a heat process board to be larger than the distance between a center portion of the substrate and the heat process board, causing the substrate to be unevenly deformed against the heat process board, causing the substrate to partly contact the heat process board, or causing the distance between the substrate and the heat process board to be at least partly varied so as to heat-process the substrate.

The heat process method further comprises the step of causing the distance between the substrate and the heat process board to be substantially increased as a pre-heat process.

The heat process method further comprises the step of removing static electricity from the substrate before the heat process is performed, while the heat process is being performed, or after the heat process is performed.

According to the present invention, the supporting members support the substrate. In the initial stage of the heat process of which the amount of heat transferred is large, the sucking means causes the substrate to contact the heat process board. After the amount of heat transferred decreases, the sucking means causes the substrate to be spaced apart from the heat process board. Thus, the substrate can be equally heated in a short time. In addition, a static breakdown can be prevented from taking place in the substrate.

According to the present invention, in the initial stage of which the amount of heat transferred is large, the vacuum degree is increased so as to contact the substrate to the heat process board. On the other hand, after the amount of heat transferred to the substrate decreases, the vacuum degree is decreased. Thus, since the substrate restores to the original shape due to its rigidity, the substrate is separated from the heat process board. Thus, the substrate can be equally heated in a short time. In addition, a static breakdown can be prevented from taking place in the substrate.

A peripheral portion of the substrate is more easily cooled than a center portion thereof. Thus, according to the present invention, a larger amount of heat is supplied to the peripheral portion of the substrate than the center portion thereof. Thus, the entire substrate can be equally heat-processed.

These and other objects, features and advantages of the present invention will become more apparent in light of the following detailed description of a best mode embodiment thereof, as illustrated in the accompanying drawings.

DETAILED DESCRIPTION OF THE INVENTION

Next, as a first embodiment of the present invention, a resist process system that forms photoresist on the front surface of a glass substrate G (hereinafter referred to as substrate G) for use with a liquid crystal display (LCD) will be described. It should be noted that the present invention can be also applied to a plate substrate such as a semiconductor wafer as well as the substrate G.

Figure 1:
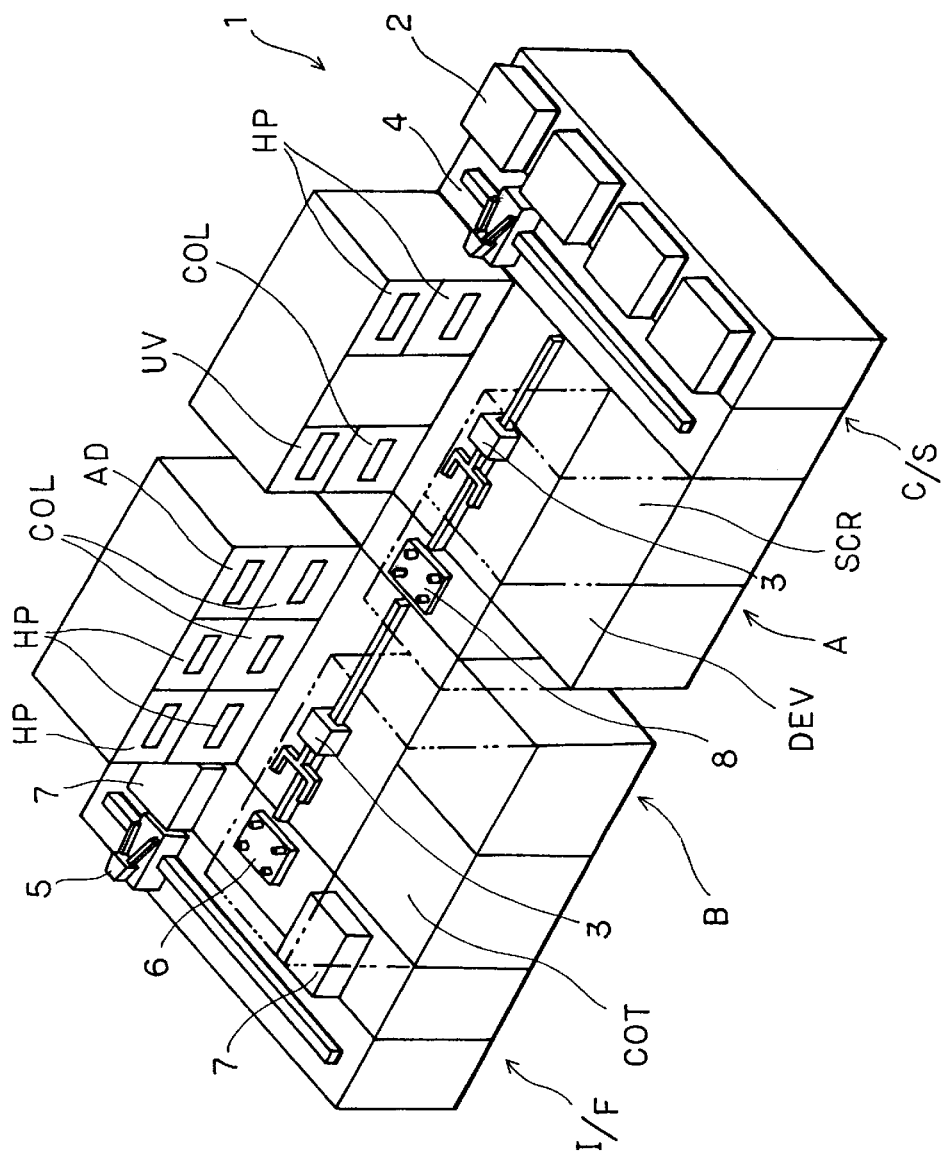
FIG. 1 is a perspective view showing the structure of a coating and developing unit according to a first embodiment of the present invention.
Figure 2:
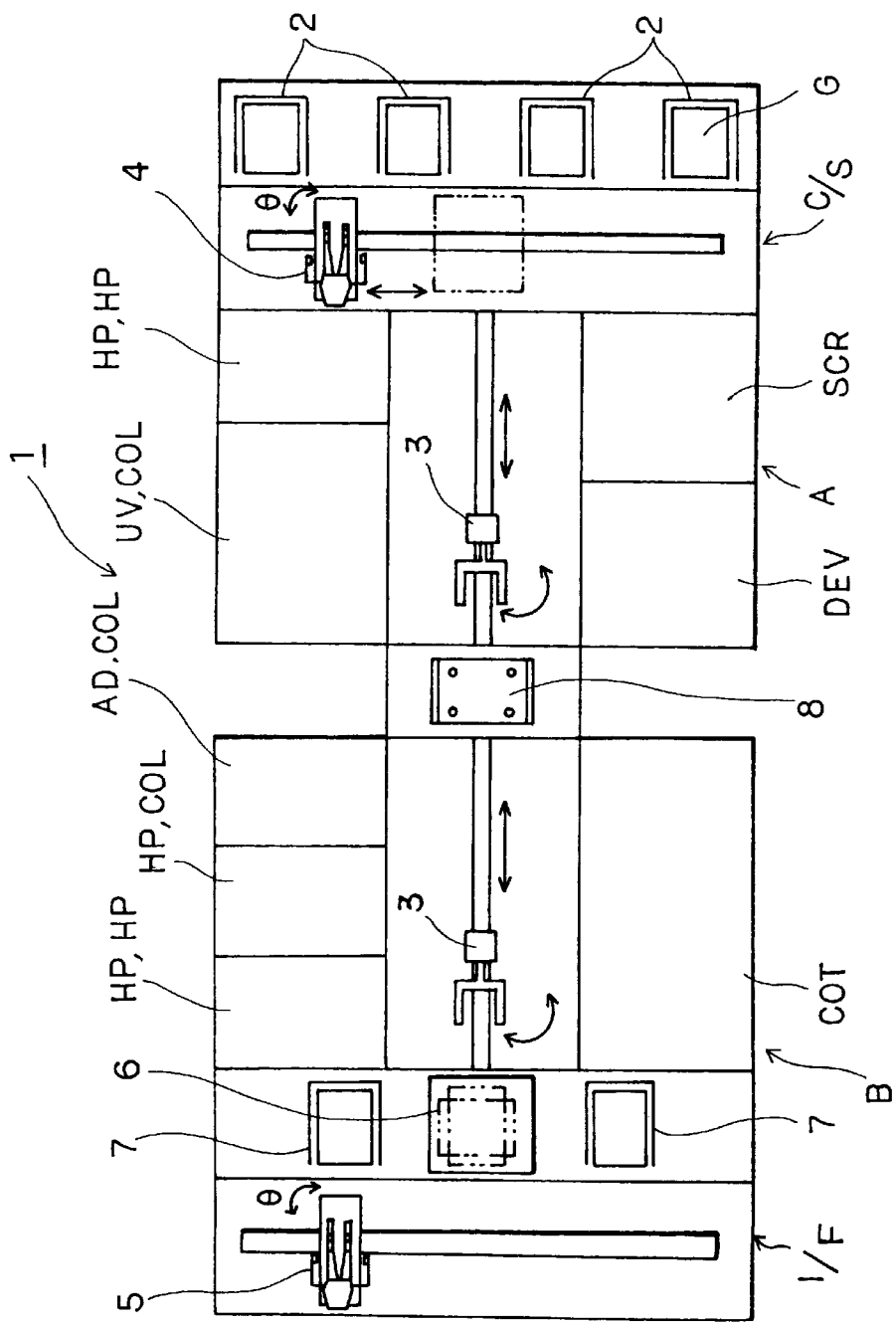
FIG. 2 is a plan view showing the structure of the coating and developing unit according to the first embodiment of the present invention.

FIG. 1 is a perspective view showing the structure of a coating and developing unit according to a first embodiment of the present invention. FIG. 2 is a plan view of FIG. 1.

The coating and developing unit 1 has a cassette station C/S. The cassette station C/S is disposed on one end side of the coating and developing unit 1.

An interface unit I/F is disposed on the other end side of the coating and developing unit 1. The interface unit I/F conveys an LCD glass substrate G (hereinafter referred to as substrate) to/from an exposing unit (not shown).

A plurality of cassettes 2 (in this example, four cassettes 2) are disposed on the cassette station C/S. Each cassette 2 accommodates a substrate G such as an LCD substrate. An auxiliary arm 4 is disposed on the front side of the cassettes 2 of the cassette station C/S. The auxiliary arm 4 conveys and aligns a substrate G as a workpiece. In addition, the auxiliary arm 4 holds the substrate G and conveys it to/from the main arm 3.

The interface unit I/F has an auxiliary arm 5 that conveys a substrate G to/from the exposing unit (not shown). In addition, an extension portion 6 and a buffer unit 7 are disposed on the interface unit I/F. The extension portion 6 conveys a substrate G to/from the main arm 3. The buffer unit 7 temporarily holds the substrate G.

Two main arms 3 are disposed in series in the coating and developing unit 1. The main arms 3 travel in the longitudinal direction of the center portion of the coating and developing unit 1. On both sides of conveying paths of the main arms 3, a first process unit group A and a second process unit group B are disposed. A relaying portion 8 is disposed between the first process unit group A and the second process unit group B. The relaying portion 8 temporarily holds a substrate G and cools it.

In the first process unit group A, a washing process unit SCR and a developing process unit DEV are disposed on one side of the main arm 3. The washing process unit SCR washes a substrate G. The developing process unit DEV performs a developing process for the substrate G. In addition, two-stacked heat process units HP and two-stacked UV process unit/cooling unit COL are disposed on the other side of the main arm 3 so that these units face the washing process unit SCR and the developing process unit DEV.

In the second process unit group B, a coating process unit COT is disposed on one side of the main arm 3. The coating process unit COT performs a resist coating process and an edge removing process. In addition, two-stacked adhesion unit AD/cooling unit COL, two-stacked heat process unit HP/cooling unit COL, and two-stacked heat process units HP are disposed on the other side of the main arm 3. When a heat process unit HP and a cooling unit COL are stacked, the heat process unit HP and the cooling unit COL are disposed as an upper unit and a lower unit, respectively. Thus, since a mutual thermal interference between the heat process unit HP and the cooling unit COL can be prevented, the temperature can be accurately controlled.

Each of the main arms 3 has an X-axis driving mechanism, a Y-axis driving mechanism, and a Z-axis driving mechanism. In addition, each of the main arm 3 has a rotation driving mechanism that rotates around the Z axis. Each of the main arms 3 travels along the center path of the coating and developing unit 1 so as to convey a substrate G among individual process units. In addition, each of the main arms 3 loads a raw substrate G to each process unit and unloads a processed substrate G from each process unit.

In the coating and developing unit 1 according to the first embodiment, since individual process units are integrally disposed, the space of the unit can be reduced and the process efficiency can be improved.

In the coating and developing unit 1, a substrate G accommodated in a cassette 2 is conveyed to the washing process unit SCR through the auxiliary arm 4 and the main arm 3. The washing process unit SCR performs a washing process for the substrate G.

Next, the substrate G is conveyed to the adhesion unit AD through the main arm 3, the relaying portion 8, and the main arm 3. The adhesion unit AD performs a hydrophobic process for the substrate G so as to improve the adhesion characteristics of the resist.

Thereafter, the substrate G is conveyed to the cooling unit COL through the main arm 3. The cooling unit COL cools the substrate G. Next, the substrate G is conveyed to the coating process unit COT through the main arm 3. The coating process unit COT coats resist to the substrate G.

Next, the substrate G is conveyed to the heat process unit HP through the main arm 3. The heat process unit HP performs a pre-baking process for the substrate G. The substrate G is conveyed to the cooling unit COL through the main arm 3. The cooling unit COL cools the substrate G. Thereafter, the substrate G is conveyed to the exposing unit through the main arm 3 and the interface portion I/F. The exposing unit exposes a predetermined pattern to the substrate G.

The resultant substrate G is loaded to the coating and developing unit 1 through the interface portion I/F. The substrate G is conveyed to the heat process unit HP through the main arm 3. The heat process unit HP performs a post exposure baking process for the substrate G.

Thereafter, the substrate G is loaded to the cooling unit COL through the main arm 3, the relaying portion 8, and the main arm 3. The cooling unit COL cools the substrate G. The resultant substrate G is conveyed to the developing process unit DEV through the main arm 3. The developing process unit DEV performs a developing process for the substrate G so as to form a predetermined circuit pattern. The resultant substrate G is conveyed to the post baking process unit HP through the main arm 3. The post baking process unit HP performs a post-baking process for the substrate G.

The resultant substrate G is accommodated in a predetermined cassette 2 on the cassette station C/S through the main arm 3 and the auxiliary arm 4.

Next, with reference to FIGS. 3, 4A, and 4B, the structure and operation of each heat process unit such as a baking unit (PREBAKE), a baking unit (PEB), a cooling unit (COL), or a cooling unit (EXTCOL) will be described.

Figure 3:
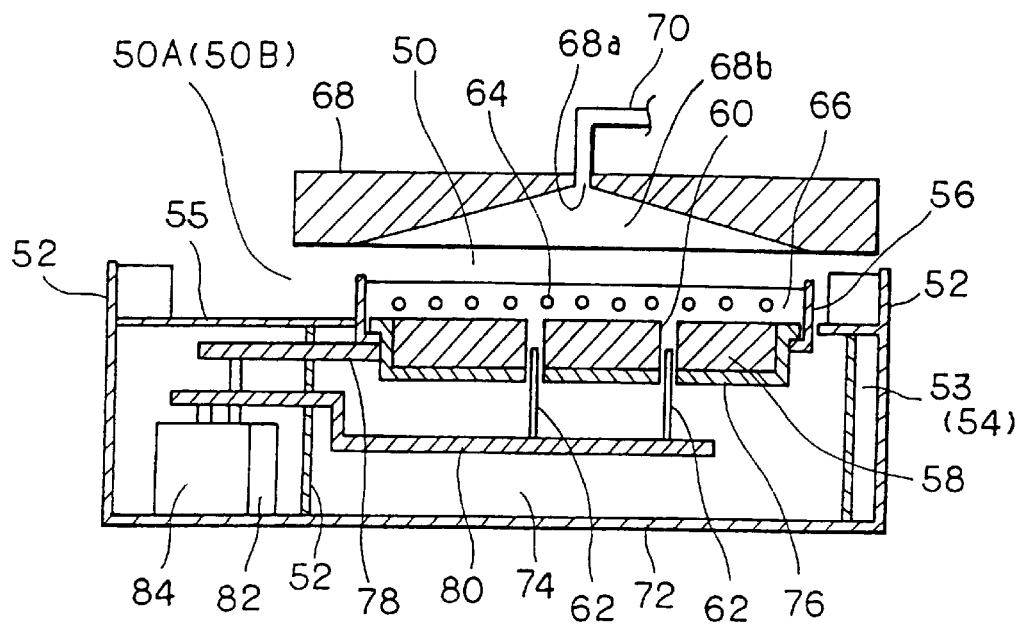
FIG. 3 is a vertical sectional view showing the structure of a heat process unit according to the first embodiment of the present invention.

FIG. 3 is a sectional view showing the structure of the heat process unit according to the first embodiment of the present invention. FIG. 4A is a plan view of FIG. 3. FIG. 4B is a perspective view of FIG. 3. In FIGS. 4A and 4B, for simplicity, a horizontal sealing plate is omitted.

A process chamber 50 of the heat process unit is formed of a both-side wall 53 and a horizontal sealing plate 55. Opening portions 50A and 50B are formed on the front side (facing the main wafer conveying mechanism 24) and the rear side of the process chamber 50, respectively. A square opening 56 is formed at a center portion of the sealing plate 55. A square heat process board 58 is disposed as a holding table in the opening 56. For example, four holes 60 are formed in the heat process board 58. Lift pins 62 are slidably disposed in the respective holes 60. When the substrate G is loaded or unloaded, the lift pins 62 are protruded (raised) from the front surface of the heat process board 58 so that the substrate G is conveyed between the main conveying mechanism 22 and the holding members 48.

A shutter 66 is disposed around the heat process board 58. The shutter 66 is composed of a square frame-shaped plate having many vent holes 64, circumferentially formed at intervals of ⌀. Normally, the shutter 66 is positioned below the heat process board 58. When the heat process is performed, the shutter 66 is raised to a position higher than the upper surface of the heat process board 58. Thus, the shutter 66 forms a square frame-shaped side wall between the heat process board 58 and the cover member 68. In this state, down-flow air or inert gas such as nitrogen gas is equally supplied in the circumferential direction from an air supplying system (not shown) through the vent holes 64.

An exhaust hole 68a is disposed at a center portion of the cover member 68. The exhaust hole 68a exhausts gas generated on the front surface of the substrate G in the heat process. An exhaust pipe 70 is connected to the exhaust hole 68a. The exhaust pipe 70 is connected to a duct 53 (54) disposed on the front side of the unit (facing the main wafer conveying mechanism 22). Alternatively, the exhaust pipe 70 is connected to another duct (not shown).

A mechanical chamber 74 is disposed below the sealing plate 55. The mechanical chamber 74 is formed of the sealing plate 55, the both-side wall 53, and a bottom plate 72. In the mechanical chamber 74, a heat process board holding plate 76, a shutter arm 78, a holding pin arm 80, a shutter arm lift driving cylinder 82, and a lift pin arm driving cylinder 84 are disposed.

Figure 4A:
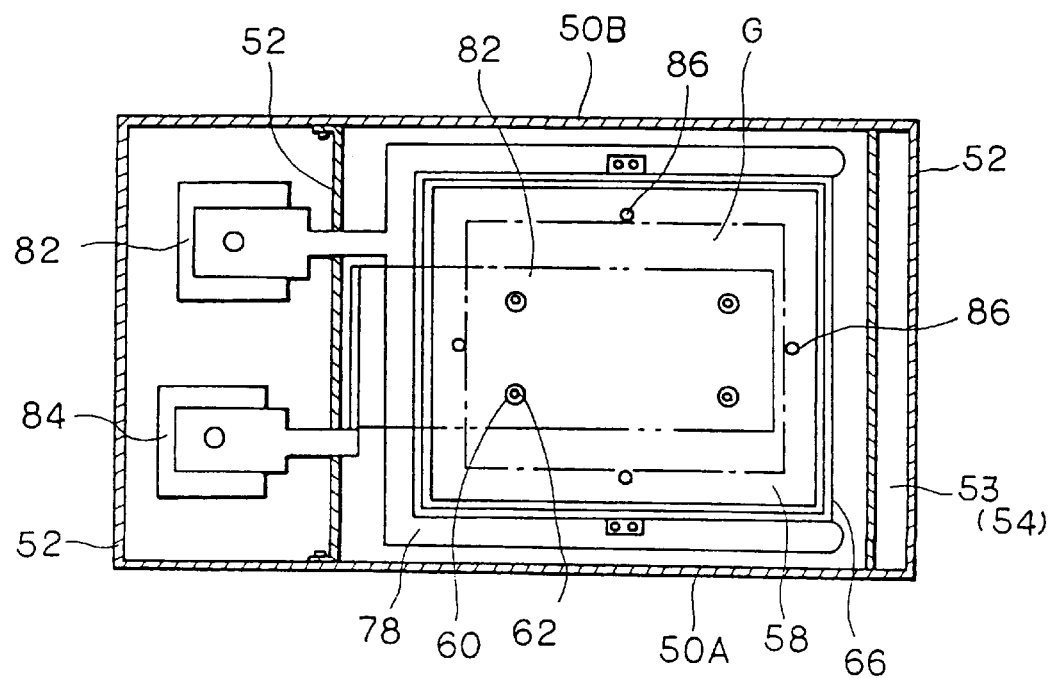
FIG. 4A is a plan view showing the structure of the heat process unit according to the first embodiment of the present invention.

As shown in FIG. 4A, a plurality of (for example, four) substrate G guiding/holding protrusions 86 are disposed on the front surface of the heat process board 58 so that the outer peripheral portion of the substrate G is placed on the substrate G guiding/holding protrusions 86.

As shown in FIG. 3, a circular-cone shaped concave portion 68b is formed on the lower surface of the cover member 68. An exhaust hole 68a is formed at a portion corresponding to the vertex of the circular cone. A lower edge of the exhaust pipe 70 is connected to the exhaust hole 68a. The other edge of the exhaust pipe 70 is connected to an exhaust system (not shown). Air heated by the heat process board 58 rises and gathers at the circular-cone shaped concave portion 68b. The heated air is exhausted from the concave portion 68b through the exhaust hole 68a and the exhaust pipe 70.

Figure 4B:
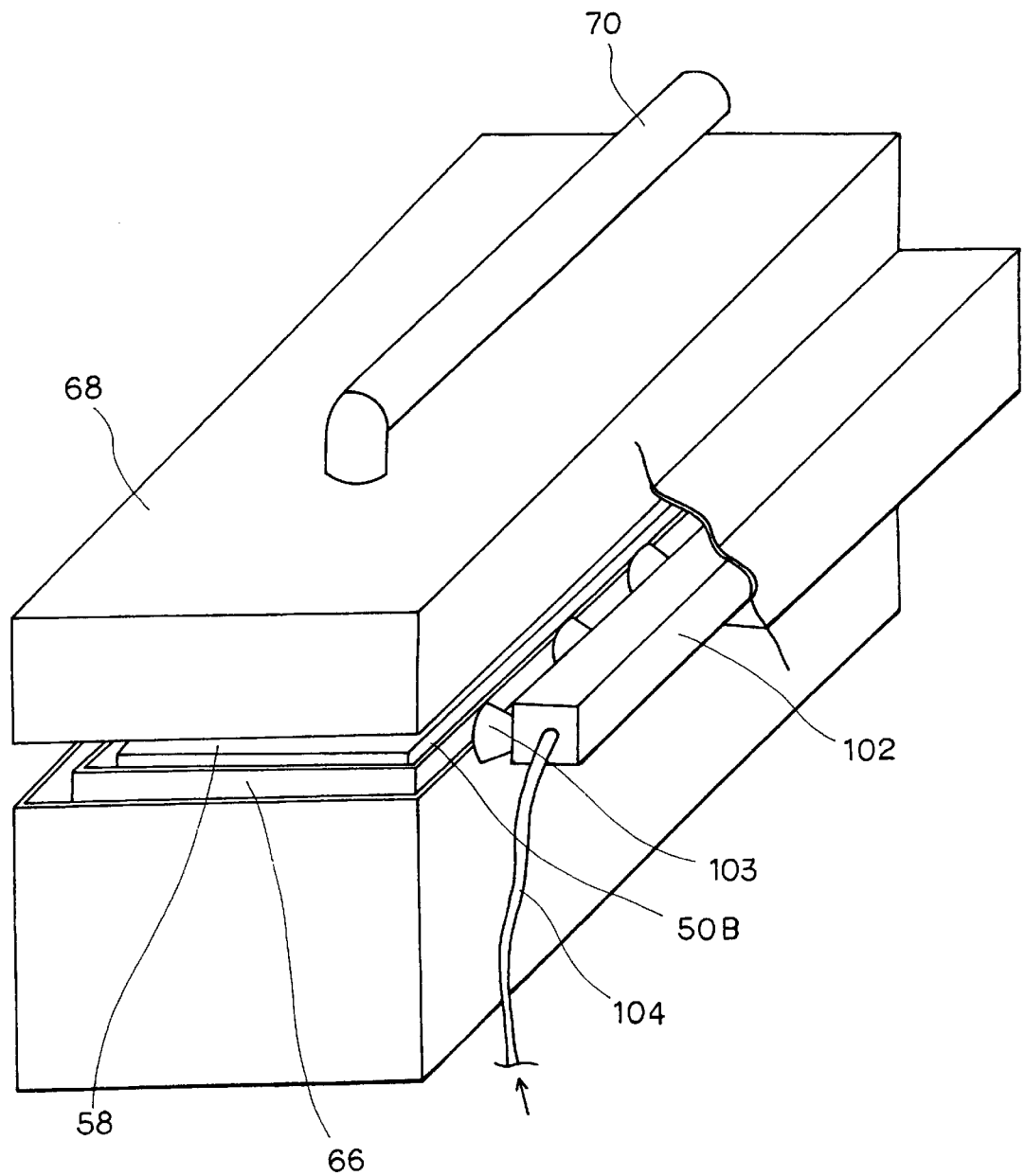
FIG. 4B is a perspective view showing the structure of the heat process unit according to the first embodiment of the present invention.

As shown in FIG. 4B, a static electricity removing means (for example an ionizer 102) that removes static electricity from the substrate G is disposed at the opening portion 50B on the rear side of the process chamber 50. The ionizer 102 has nozzle-shaped air splay openings 103 formed at equal intervals in the horizontal direction of the ionizer 102 so that the length of both ends of the air splay openings 103 is longer than the length of the longer side of the substrate G. Discharge electrodes (not shown) are disposed at predetermined positions (for example, center portions) of the respective air splay openings 103. Ions generated by the discharge electrodes are sprayed to the holding surface of the substrate and the front and rear surfaces of the substrate using a flow of air or ionized gas such as nitrogen gas or another inert gas that are sprayed from an air spray opening. Thus, static electricity charged on the holding surface of the substrate and the rear surface of the substrate can be removed.

Figure 5:
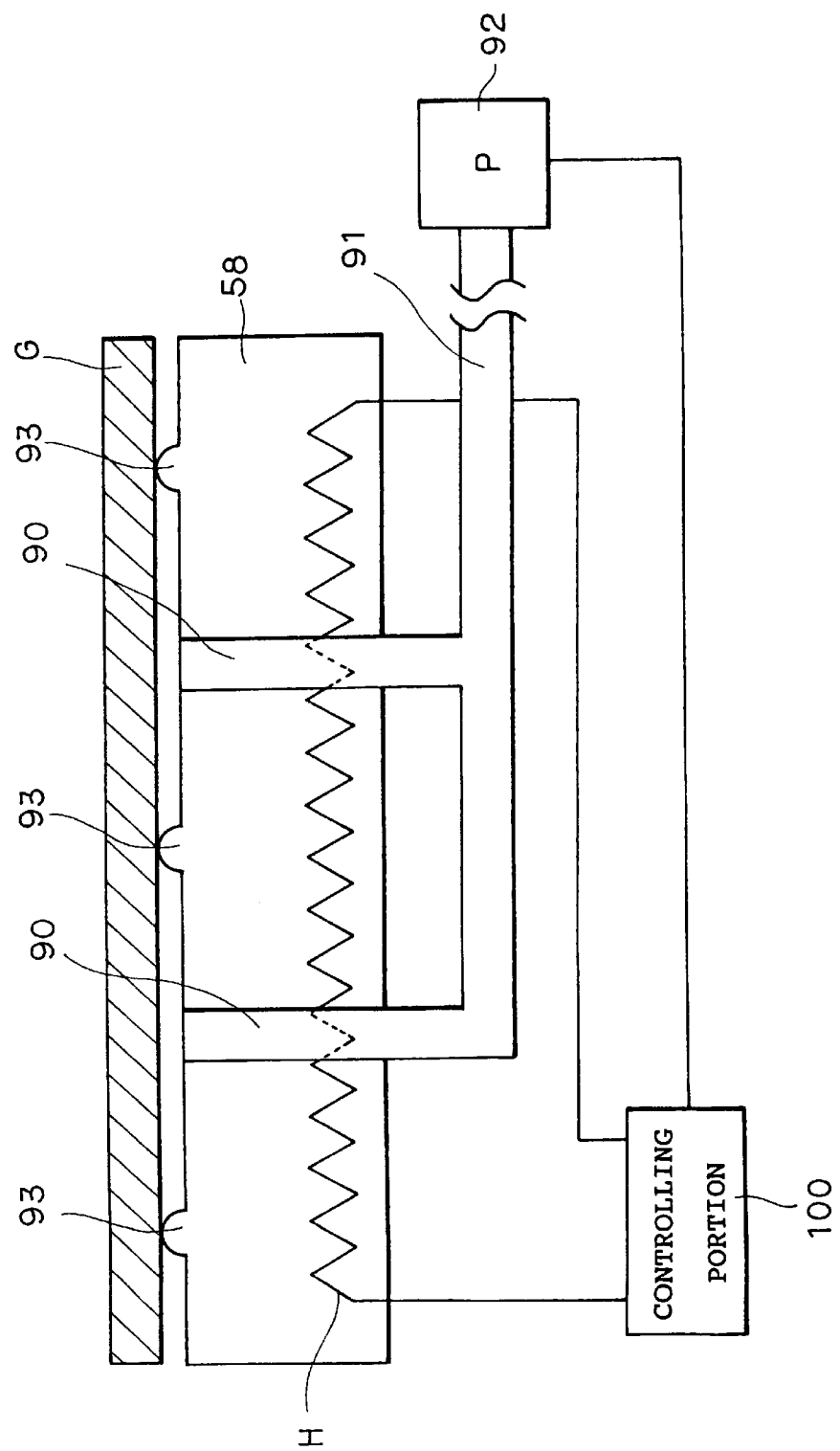
FIG. 5 is a vertical sectional view showing the structure of the heat process unit according to the first embodiment of the present invention.

FIG. 5 is a vertical sectional view showing the structure of the heat process board 58 according to the first embodiment and the peripheral portion thereof.

As shown in FIG. 5, a heater H is disposed in the heat process board 58. The heater H is composed of a heating member such as a nichrome wire. When the power is supplied to the heater H, the heat process board 58 is heated.

As shown in FIG. 5, the heater H is connected to a controlling portion 100. A sensor (not shown) is disposed in the heat process board 58. The sensor detects the temperature of the heat process board 58. Data corresponding to the temperature detected by the sensor is supplied to the controlling portion 100. The controlling portion 100 controls the amount of power supplied to the heater H corresponding to the temperature of the heat process board 58 detected by the sensor so as to control the temperature of the heat process board 58.

As shown in FIG. 5, a sucking means that sucks a substrate G is formed in the vertical direction of the heat process board 58. An example of the sucking means is for example through-holes 90. When the substrate G is placed on the heat process board 58, the through-holes 90 suck the substrate G. A pipe 91 is connected on the lower edge side of the through-holes 90. A sucking amount adjusting means is connected on the lower edge side of the pipe 91. An example of the sucking amount adjusting means is a pressure adjusting valve 101. The pressure adjusting valve 101 adjusts the sucking amount of air of the through-holes 90. The pressure adjusting valve 101 is connected to a vacuum pump 92. The vacuum pump 92 is connected to the controlling portion 100. The controlling portion 100 controls the operation of the vacuum pump 92. Thus, when the vacuum 92 is operated, a negative pressure takes place in the pipe 91. Consequently, a negative pressure takes place in a space formed between the upper surface of the heat process board 58 and the lower surface of the substrate G. The pressure adjusting valve is connected to the controlling portion 100. The controlling portion 100 controls the operation of the pressure adjusting valve 101. Thus, by controlling the opening amount of the pressure adjusting valve 101, the sucking amount of air of the through-holes can be adjusted.

A plurality of protrusion pins 93 referred to as proximity-pins are disposed on the upper surface of the heat process board 58. The proximity-pins 93 cause the substrate G to be spaced apart from the heat process board by a predetermined distance.

The proximity-pins (hereinafter simply referred to as pins) 93 form a small space between the upper surface of the heat process board 58 and the lower surface of the substrate G placed on the heat process board 58 so as to prevent friction and thereby a static breakdown from taking place between the substrate G and the heat process board 58. The height of the pins 93 is designated so that when the vacuum pump 92 is not operated, the substrate G is almost horizontally held at the vertexes of the pins 93 and a space is formed between the lower surface of the substrate G and the upper surface of the heat process board 58 and so that when the vacuum pump 92 is operated and a negative pressure takes place between the upper surface of the heat process board 58 and the lower surface of the substrate G, the substrate G skews and thereby a portion thereof between adjacent pins 93 directly contacts the upper surface of the heat process board 58.

Although the height of the pins 93 depends on the arrangement thereof, the intervals of adjacent pins, the rigidity and thickness of the substrate G, and so forth, the height of the pins 93 is preferably in the range from 0.2 mm to 0.3 mm.

In other words, when the height of the pins 93 is less than 0.2 mm, since the areas of the pins 93 contacting the substrate and the heat process board increase, the substrate G cannot be prevented from being charged due to friction.

On the other hand, when the height of the pins 93 exceeds 0.3 mm, since the substrate G cannot be sucked to the heat process board due to a low vacuum pressure, heat cannot be quickly transferred between the substrate G and the heat process board. In particular, the peripheral portion of the substrate G cannot be vacuum-sucked.

In the first embodiment of the present invention, the height of the pins 93 is 0.2 mm.

The pins 93 are disposed so that when the vacuum pump 92 is not operated, the substrate G is almost horizontally held at the vertexes of the pins 93 and a space is formed between the lower surface of the substrate G and the upper surface of the heat process board 58 and so that when the vacuum pump 92 is operated and thereby a negative pressure is applied between the upper surface of the heat process board 58 and the lower surface of the substrate G, the substrate G skews and thereby a portion of the substrate G corresponding to the adjacent pins 93 directly contacts the upper surface of the heat process board 58.

In the first embodiment of the present invention, the pins 93 are disposed in a rhombus shape of which the center point of each side of the substrate G corresponds to the vertex of each pin 93. A total of nine pins 93 are disposed at the center point of the rhombus shape and the center point of each side thereof.

A predetermined voltage is applied to the lift pins 62 and the pins 93. For example, the lift pins 62 and the pins 93 are grounded. In addition, a resistor is disposed in the middle of the line so that static electricity travels to the ground gradually rather than quickly so as to prevent a static breakdown from taking place in the substrate G. Thus, when the substrate G contacts the lift pins 62 and the pins 93, static electricity on the substrate G gradually travels to the pins 62 and the pins 93. Consequently, the static electricity can be removed from the substrate G.

Next, the operation of the heat process unit (HP) according to the first embodiment of the present invention will be described.

After a pre-process is completed in the coating process unit (COT), the developing process unit (DEV), or the like, the main arm 3 accesses a relevant process unit and unloads a substrate G therefrom. The main arm 3 holds the substrate G, travels through the center path, and stops in front of the heat process unit (HP). At this point, the main arm 3 turns to the front surface of the heat process unit (HP). Thereafter, the main arm 3 extends the substrate holding member and conveys the substrate G to a position just above the heat process board 58 in the heat process unit (HP). In the heat process unit (HP), the lift pins 62 are raised to a position higher than the upper surface of the heat process board 58. At this point, the edges of the lift pins 62 are raised to a position higher than the substrate G placed at the edge of the main arm 3. Thus, the substrate G is raised by the lift pins 62. Next, the substrate G is conveyed from the main arm 3 to the lift pins 62.

Figure 7:
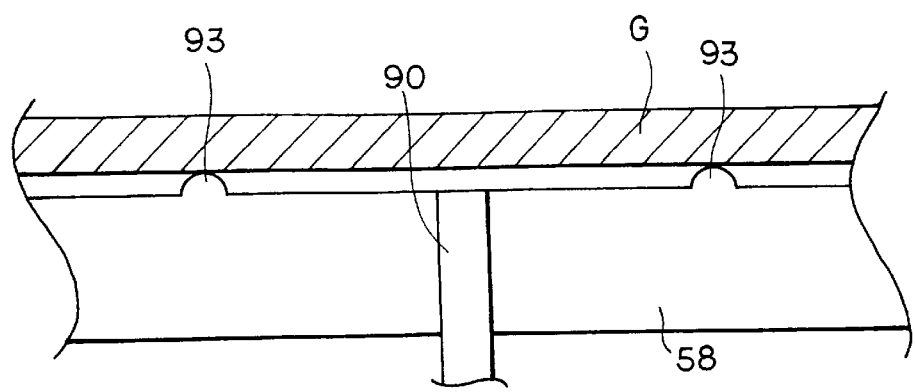
FIG. 7 is a vertical sectional view showing the structure of the heat process unit according to the first embodiment of the present invention.

In this state, the main arm 3 retreats and travels out of the heat process unit (HP). As the lift pins 62 are lowered, the substrate G is lowered and approached to the upper surface of the heat process board 58. When the lift pins 62 are lowered to a position lower than the upper surface of the heat process board 58, the substrate G is placed on the heat process board 58. FIG. 7 is a vertical sectional view showing the state that the substrate G is placed on the heat process board 58.

When the lift pins 62 are lowered to a position lower than the upper surface of the heat process board 58 as shown in FIG. 7, the lower surface of the substrate G contacts the edges of the pins 93 disposed on the upper surface of the heat process board 58. Thus, since the substrate G is held by the edges of the pins 93, the substrate G is not further lowered. Consequently, a small space is formed between the lower surface of the substrate G and the upper surface of the heat process board 58 in such a manner that most portions of the lower surface of the substrate G do not contact the upper surface of the heat process board 58.

Next, the state that the heat process board 58 performs a heat process for the substrate G will be described.

Figure 8:
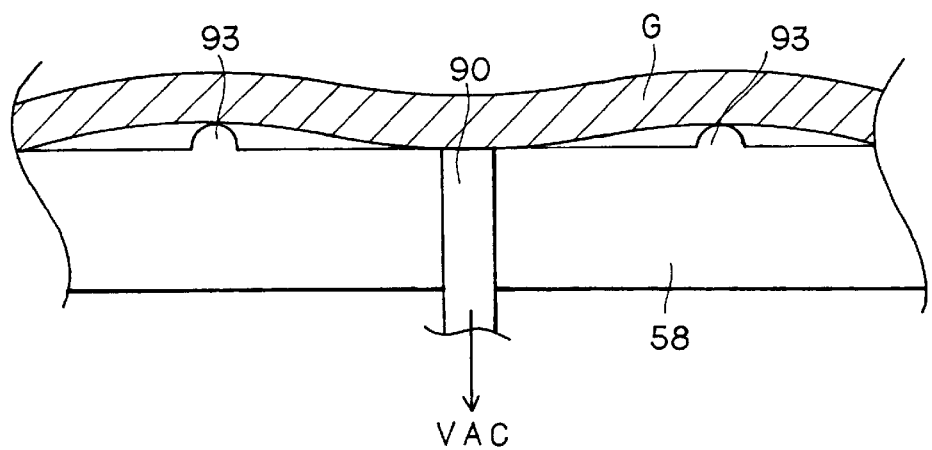
FIG. 8 is a vertical sectional view showing the structure of the heat process unit according to the first embodiment of the present invention.
Figure 9:
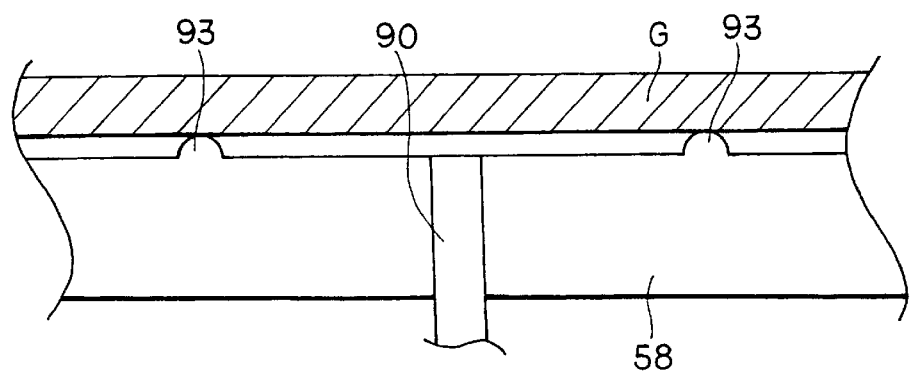
FIG. 9 is a vertical sectional view showing the structure of the heat process unit according to the first embodiment of the present invention.
Figure 10:
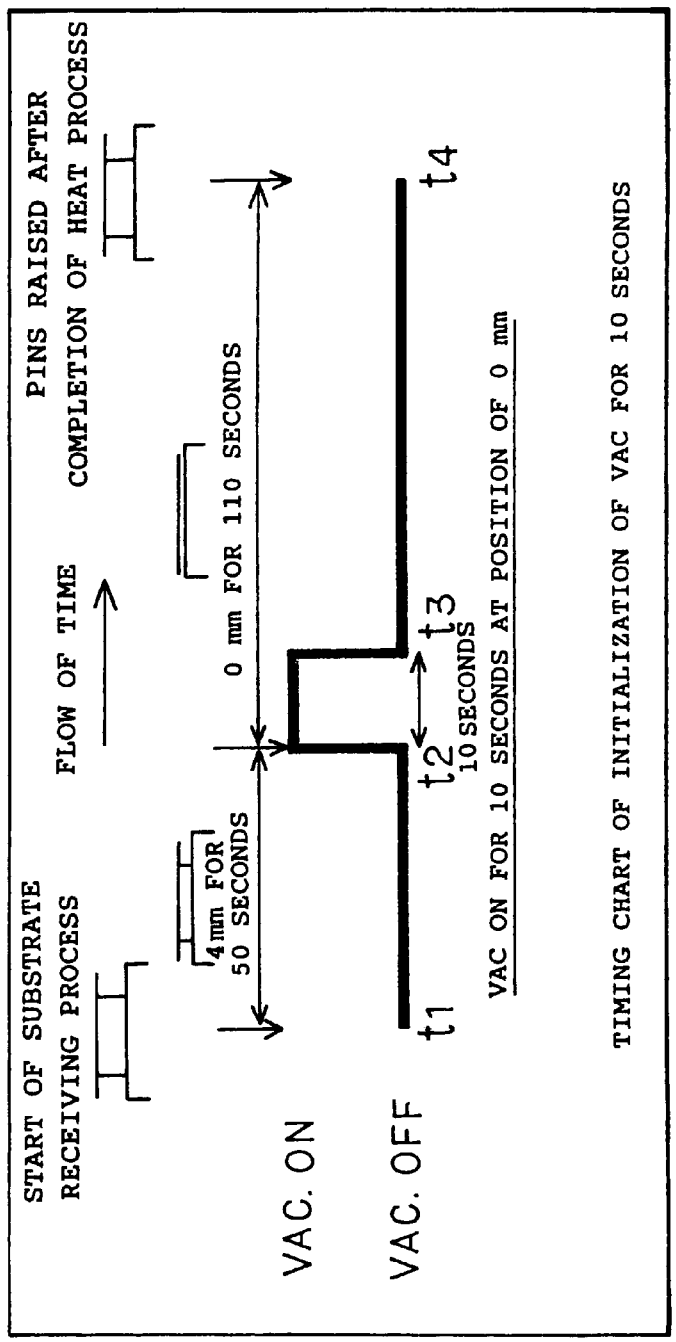
FIG. 10 is a timing chart showing the operation of the heat process unit according to the first embodiment of the present invention.

FIG. 10 is a timing chart showing the heat process of the heat process board 58 for the substrate G. FIGS. 8 and 9 are vertical sectional views showing the state that the substrate G is heat-processed.

As shown in FIG. 10, at time t1, a substrate G is conveyed from the main arm 3 to the lift pins 62. After the main arm 3 is retreated, ionized gas generated by the ionizer 102 is sprayed to the substrate G. Thus, static electricity charged on the substrate G is removed. The lift pins 62 are lowered for 50 seconds until the space between the substrate G and the heat process board 58 becomes 4 mm at time t2 (preliminary heat process step). In a time period from t1 to t2, the substrate G is preliminarily heated so that the temperature difference between the front surface and the rear surface of the substrate G becomes zero. Thus, the difference of the expansion between the front surface and the rear surface of the substrate G due to the temperature difference decreases and thereby the substrate G can be prevented from skewing. Since the distance between the substrate G and the heat process board 58 is kept constant, the entire surface of the substrate G can be equally heat-processed.

At time t2, the lift pins 62 are further lowered. Thus, the substrate G is placed on the pins 93 of the heat process board 58. In addition, the vacuum pipe 91 is deaerated and the opening amount of the pressure adjusting valve 101 is controlled so as to adjust the amount of air sucked from the space between the substrate G and the heat process board 58. Since the through-holes 90 are disposed in a square shape inside the vertexes of the pins 93 formed in a rhombus shape, at least a part of a plurality of areas and a peripheral portion of the substrate is sucked as shown in FIG. 8.

As shown in FIG. 8, when the space between the substrate G and the heat process board 58 is deaerated, atmospheric pressure is downwardly applied to the substrate G. Although a portion of the substrate G corresponding to the pins 93 and an adjacent portion thereof do not vary, a portion therebetween downwardly skews. Thus, the substrate G is unevenly deformed against the heat process board 58. Consequently, a skewed bottom portion (convex portion) of the substrate G directly contacts the upper surface of the heat process board 58. Since the pins 93 are not disposed in the vicinity of the corner portions of the substrate G (except for the center point of each side thereof), the peripheral portion of the substrate G directly contacts the upper surface of the heat process board 58. Since a part of the substrate G directly contacts the heat process board 58, heat directly transfers from the heat process portion 58 to the substrate G. Thus, a large amount of heat transfers in a short time. In the state that the substrate G is sucked, since the density of the pins 93 in the center portion of the substrate G is higher than that in the other portions thereof, the distance between the center portion of the substrate G and the heat process board 58 is larger than that between the peripheral portion of the substrate G and the heat process board 58. In this case, since heat at the peripheral portion of the substrate G more easily escapes and cools than that at the center portion thereof, more heat is supplied to the peripheral portion of the substrate (in particular, the corner portions thereof) than the center portion thereof. Thus, the temperature difference between the center portion and the peripheral portion can be prevented from taking place. Consequently, the heat process can be equally performed on the entire substrate G. As a result, the yield of the process for the substrate G improves.

The deaerating state lasts for 10 seconds from t2 to t3. Thus, in a time period from t2 to t3, the state that the substrate G directly contacts the heat process board 58 is maintained.

At time t3, the deaerating state stops. The lift pins 62 are maintained at a position lower than the heat process board 58. This state lasts until time t4.

Thus, after time t3, the force that causes the substrate G to skew and contact the heat process board 58 weakens. Due to the rigidity of the substrate G, it restores to the flat state. Consequently, air gradually flows to the space between the substrate G and the heat process board 58.

Thus, in the time period from time t3 to time t4, the substrate G that has contacted the heat process board 58 gradually separates therefrom. Consequently, the distance between the substrate G and the heat process board 58 varies. On the other hand, since heat is supplied from the heat process board 58 to the substrate G through an air layer, in the time period from t3 to t4, the heat process continues.

At time t4, the lift pins 62 are raised and thereby the substrate G is raised. Thus, the substrate G is separated from the heat process board 58. Consequently, the heat process for the substrate G is completed.

The raised substrate G is conveyed to the main arm 3 in the reverse manner of the loading step to the heat process unit. The substrate G is conveyed to a relevant unit that performs the next process.

Thus, in the heat process unit according to the first embodiment of the present invention, in the initial stage of the heat process, since a substrate G is directly contacted to the heat process board 58, the substrate G can be equally heated in a short time.

In the last stage of the heat process, the substrate G is slightly separated from the heat process board 58. In this state, the heat process is performed. Thus, static breakdown due to static electricity can be prevented from taking place in the substrate G. In particular, after the deaerating process is performed, due to the rigidity of the substrate G, it is gradually separated from the heat process board 58. Thus, since the traveling speed of the substrate G against the heat process board 58 is low, static electricity due to friction can be suppressed. Consequently, a static breakdown can be more securely prevented. In addition, since the ionizer 102 always removes static electricity on the substrate G, the static breakdown can be effectively suppressed. It should be noted that the present invention is not limited to the first embodiment.

In the first embodiment, the heat process board 58 that performs a heat process for a substrate G was exemplified. However, the present invention can be applied to a cooling unit.

In the first embodiment, the heat process unit that directly heats the heat process board 58 with the hating member such as a nichrome wire was described. Alternatively, a so-called heat surface plate can be used. In the heat surface plate, gas of heat transmitting medium is circulated in a closed cavity. Liquified heat transmitting medium in the bottom of the cavity is heated by a heater. The heat process board is equally heated through the gas of the heat transmitting medium.

Figure 11A:
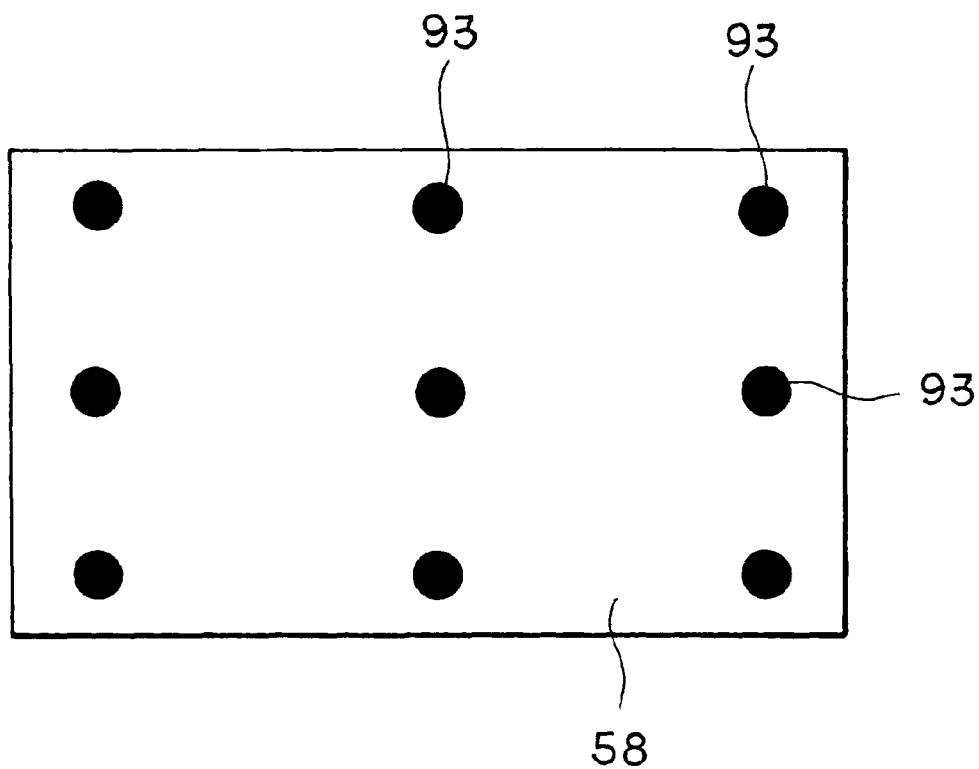
FIG. 11A is a plan view showing the structure of the heat process board according to the first embodiment of the present invention.
Figure 11B:
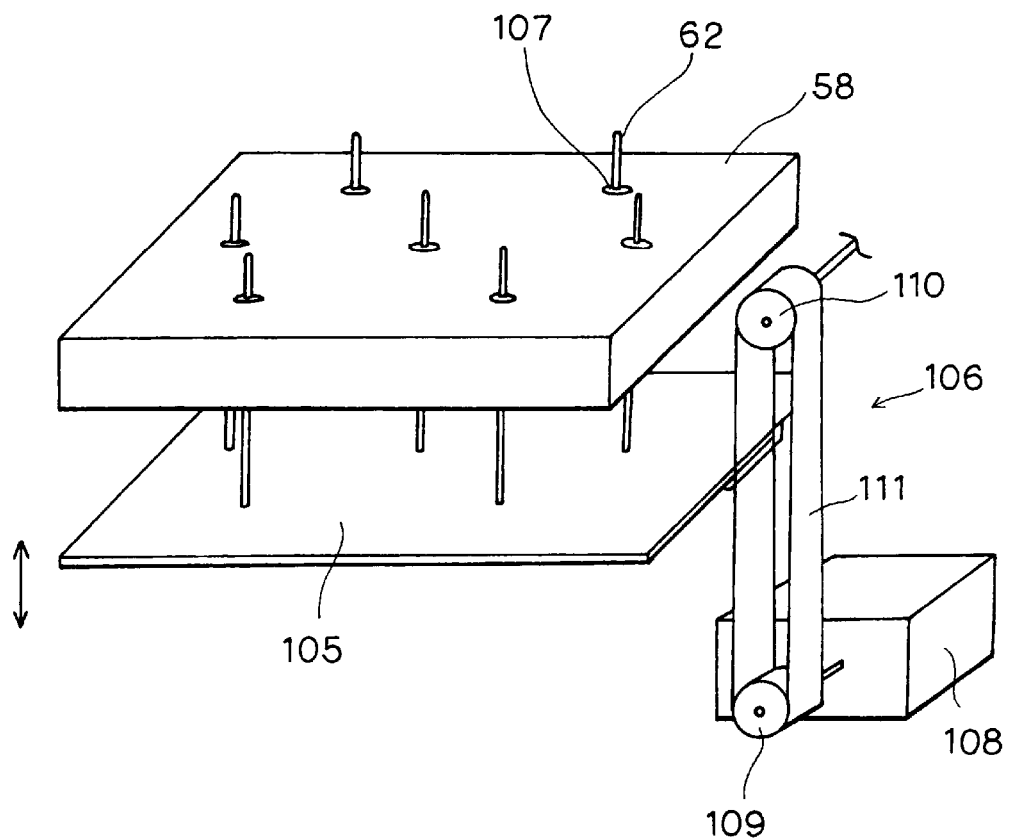
FIG. 11B is a perspective view showing the structure of a conveying means of the heat process unit according to the first embodiment of the present invention.

In the first embodiment, the pins 93 were disposed in a rhombus shape on the upper surface of the heat process board 58. However, the positions of the pins 93 are not limited as long as when the vacuum degree in the space between the substrate G and the heat process board 58 is increased, the substrate G contacts the heat process board 58 and when the vacuum degree thereof is decreased, the substrate G separates from the heat process board 58. Thus, as shown in FIG. 11A, the pins 93 may be disposed at four corners of the substrate G and the center point of each side thereof. In the first embodiment, the substrate G was placed on the pins 93 that hold the substrate G with a predetermined distance against the heat process board 58. Instead, the substrate G may be placed on the lift pins 62 (as a transferring means) that hold the substrate G with a predetermined distance against the heat process board 58 and that cause the substrate G to be approached to the heat process board 58 and separated therefrom. In this case, as shown in FIG. 11B, a holding member 105 that holds the lift pins 62 is connected to a lifting mechanism 106. The lift pins 62 are protrusively inserted into through-holes 107 of the heat process board 58 so that the lift pins 62 can be moved in the vertical direction of the heat process board 58. The lifting mechanism 106 is composed of a driving mechanism (for example, a stepping motor) 108, a driving pulley 109, a follower pulley 110, and a timing belt 111. The driving pulley 109 is driven by the stepping motor 108. The follower pulley 110 is disposed above the driving pulley 109. The timing belt 111 is wound between the driving pulley 109 and the follower pulley 110. The holding member 105 is connected to the timing belt 111. Thus, when the stepping motor 108 is rotated forward and backward, the lift pins 62 and the heat process board 58 are relatively moved upward and downward, respectively. When the heat process is performed, as shown in FIG. 10, at time t1, the substrate G is transferred from the main arm 3 to the lift pins 62. The lift pins 62 are lowered for 50 seconds until the distance between the substrate G and the heat process board 58 becomes 4 mm at time t2 (preliminary heat process step). In the time period from time t1 to time t2, the substrate G is preliminarily heated. At time t2, the lift pins 62 are further lowered until the lift pins 62 protrude for 0.2 mm on the heat process board 58. In addition, the space between the substrate G and the heat process board 58 is deaerated through the vacuum pipe 91. The deaerating state lasts for 10 seconds in the time period from time t2 to time t3. Thus, in the time period from time t2 to time t3, the substrate G directly contacts the heat process board 58 except for the vicinity of the lift pins 62. At time t3, the deaerating process is stopped. This state lasts until time t4. Thus, after time t3, the vacuum force that causes the substrate G to skew and to contact the heat process board 58 weakens. Consequently, due to the rigidity of the substrate G, it restores to the flat (horizontal) state. As a result, air gradually flows to the space between the substrate G and the heat process board 58. Thus, in the time period from time t3 to time t4, the substrate G that has contacted the heat process board 58 gradually separates therefrom except for the vicinity of the lift pins 62. Consequently, the distance between the substrate G and the heat process board 58 varies. On the other hand, heat of the heat process board 58 is supplied to the substrate G through an air layer. Thus, in the time period from time t3 to time t4, the heat process is continued. At time t4, the substrate G is raised by the lift pins 62. Thus, the substrate G is separated from the heat process board 58. Consequently, the heat process for the substrate G is completed.

In the first embodiment, ionized gas is always sprayed from the ionizer 102 to a substrate G so as to remove static electricity charged on the substrate G. However, such a static electricity removing process can be performed before the heat process is performed, while the heat process is being performed, or after the heat process is performed. When the static electricity is removed only before the heat process is performed, static electricity generated in another unit can be removed. Thus, a static breakdown due to the static electricity can be suppressed. In addition, since static electricity of the substrate G is removed before the heat process is performed, rubbish can be prevented from being attracted to the substrate G. Thus, the heat process can be equally performed on the entire surface of the substrate G. In addition, since ionized gas is not sprayed to the substrate G while the heat process is being performed, the temperature distribution of the substrate G does not deviate. Thus, the heat process can be equally performed on the entire surface of the substrate G. When static electricity is removed while the heat process is being performed, since the electric charge due to friction against the heat process board 58 can be removed, a static breakdown can be prevented. In this case, the temperature of the ionized gas is adjusted to the process temperature of the substrate G so as to prevent the temperature distribution of the substrate G from deviating. In addition, heat may be preliminarily supplied to the substrate G. Thus, the heat process time can be shortened. When static electricity is removed after the heat process is performed, as with the theory of a condenser, the voltage of the substrate G is proportional to the distance between the substrate G and the heat process board 58. Thus, the substrate G tends to discharge. To prevent such a problem, while the substrate G is gradually separated from the heat process board 58 or after the substrate G is separated from the heat process board 58, static electricity charged on the substrate G is removed. Thus, the electric charge generated in the heat process can be effectively removed. In the case that static electricity is removed before and after the heat process is performed, while the heat process is being performed, since the substrate G is close to the heat process board 58, even if static electricity is charged on the substrate G, the voltage of the substrate G is low. Thus, even if static electricity is not removed, it is quickly discharged from the substrate G. Consequently, a static breakdown does not take place in the substrate G. In addition, since ionized gas whose temperature has been adjusted is not sprayed while the heat process is being performed, the temperature distribution of the substrate G does not deviate. Thus, the heat process can be equally performed on the entire surface of the substrate G. When static electricity is removed while the heat process is being performed and after the heat process is performed, the static electricity removing time can be shortened in comparison with the case that static electricity is removed before the heat process is performed, while the heat process is being performed, or after the heat process is performed. Thus, the throughput of the heat process can be improved. In addition, when ionized gas is sprayed periodically rather than always, the deterioration of the ionizer 102 can be suppressed. Thus, the service life of the ionizer 102 can be prolonged. Moreover, power and gas for generating ions can be suppressed. Thus, the running cost of the apparatus can be suppressed.

In the first embodiment, the heat process unit that performs a heat process for an LCD substrate G was described. However, it should be noted that the present invention can be applied to a silicon wafer heat process unit.

Next, a measuring method for determining effects of the heat process unit according to the first embodiment of the present invention will be described.

An occurrence of static electricity and equality of the substrate temperature in the heat process for a substrate G were measured.

The equality of the substrate temperature was measured in atmospheric conditions of a temperature of 23.5° C. and a humidity of 59%. As a heat process (prebake) condition, the temperature of the heat process board was set to 139° C. The height of the lift pins was kept at 4 mm for 50 seconds. Thereafter, the lift pins were lowered to a position of 0 mm. In the state, the substrate G was kept for 110 seconds. The timing chart of the measuring method is the same as that shown in FIG. 10.

Figure 6:
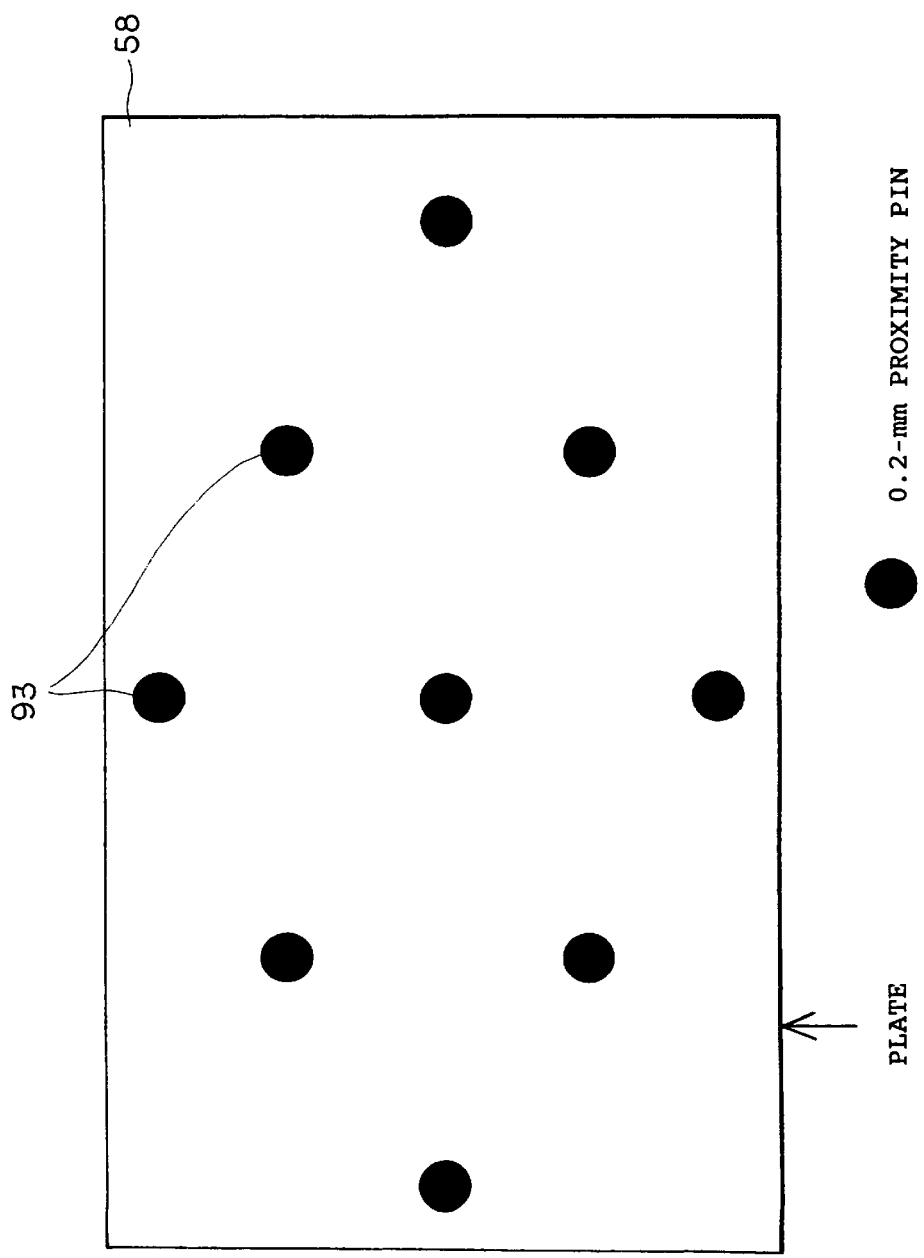
FIG. 6 is a plan view showing the structure of a heat process board according to the first embodiment of the present invention.

The gap of the pins disposed on the upper surface of the heat process board (namely, the height from the upper surface of the heat process board to the edges of the pins) was 0.2 mm. Nine pins were disposed in a rhombus shape as shown in FIG. 6. The vacuum degree of the source pressure of the vacuum pump that sucks the substrate G on the heat process board was 5 kPa. The vacuum degree detected by a sensor was in the range from 3.2 to 4.8 kPa.

Figure 12:
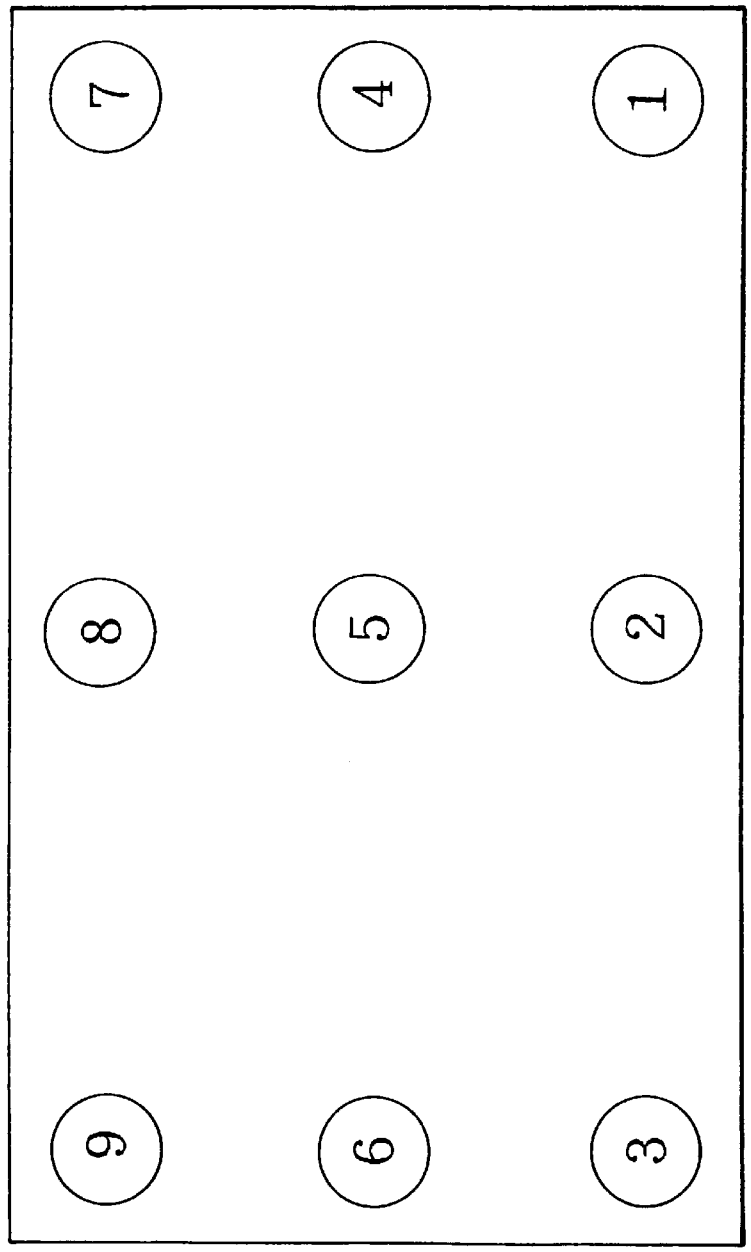
FIG. 12 is a plan view showing the structure of the heat process board according to the first embodiment of the present invention.

As measurement samples, three substrates were used. The first substrate was a substrate coated with a Cr film. The second substrate was a glass substrate. The third substrate was a substrate coated with a SiNx film. A K-type thermocouple was adhered to each of the measurement samples with a polyimide tape. These samples were measured with a measurement device R7430 DATA LOGER (ADVANTEST Company). The samples were measured at nine points on their front surfaces as shown in FIG. 12. FIGS. 13 to 18 show measured results.

Figure 13:
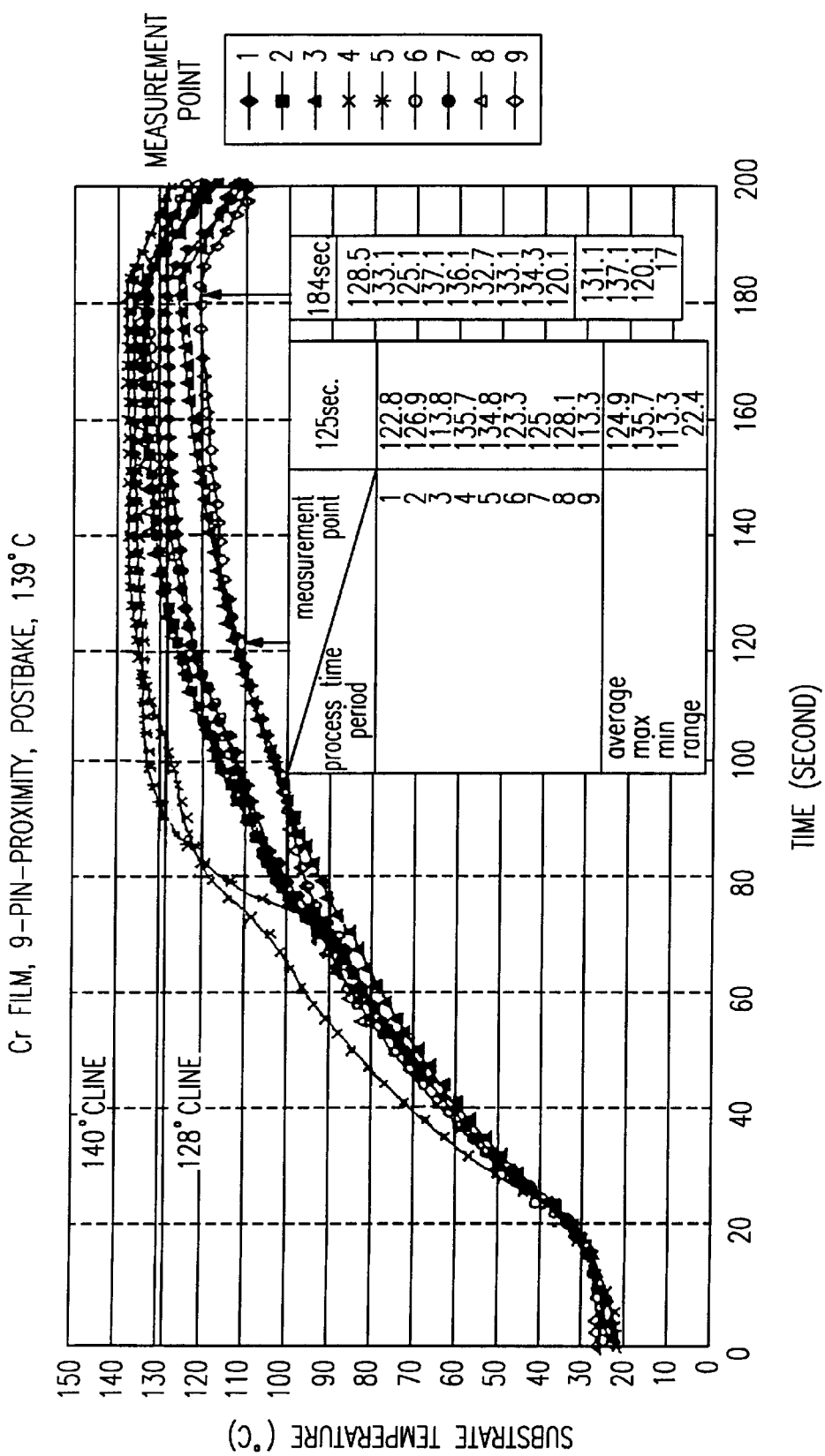
FIG. 13 is a graph showing a temperature rise curve of a substrate.
Figure 14:
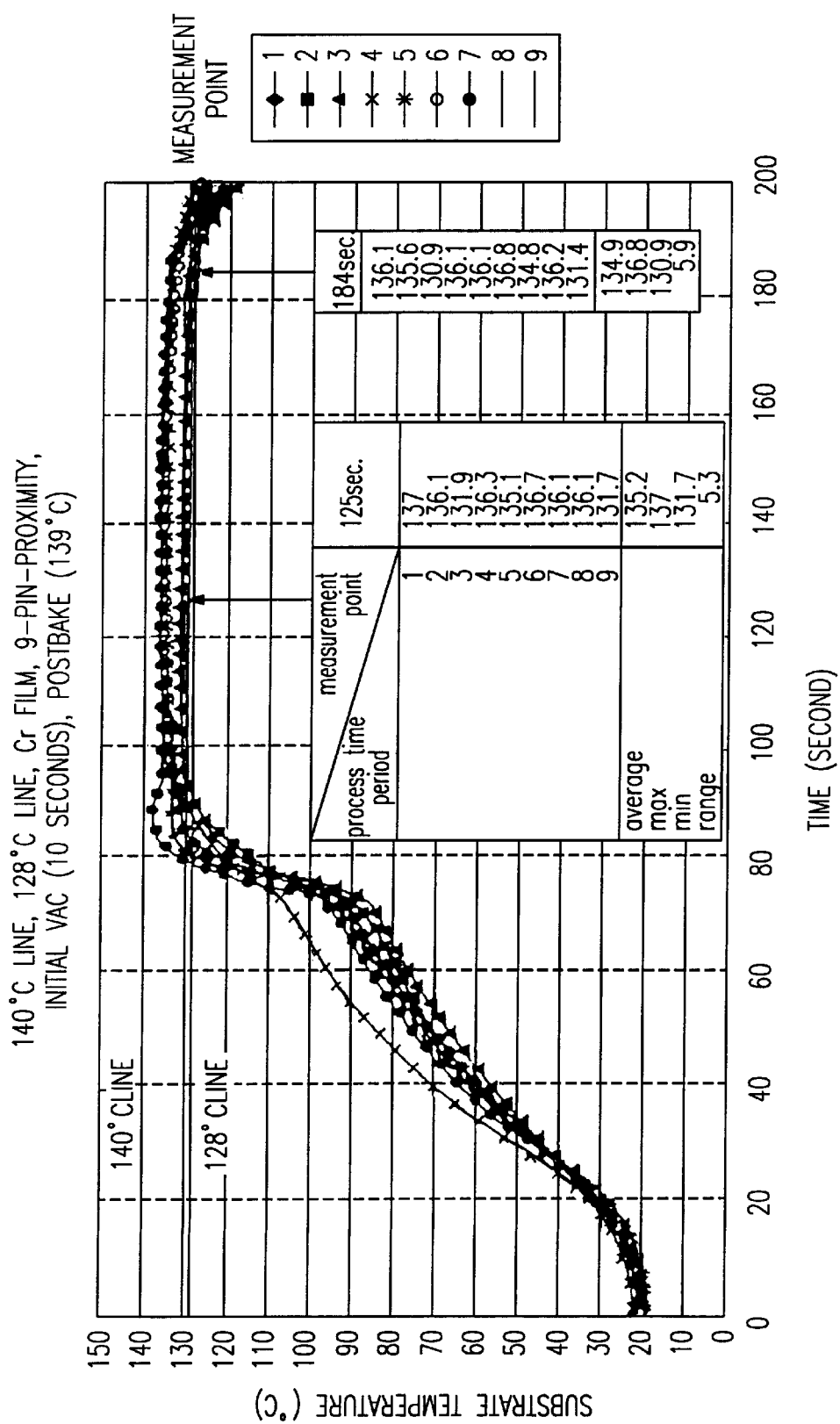
FIG. 14 is a graph showing a temperature rise curve of a substrate.

FIG. 13 is a graph showing a temperature rising curve of which the substrate coated with the Cr film was heated through the pins. FIG. 14 is a graph showing a temperature rising curve of which the substrate coated with the Cr film is vacuum-sucked for 10 seconds in the initial stage and then heated.

Figure 15:
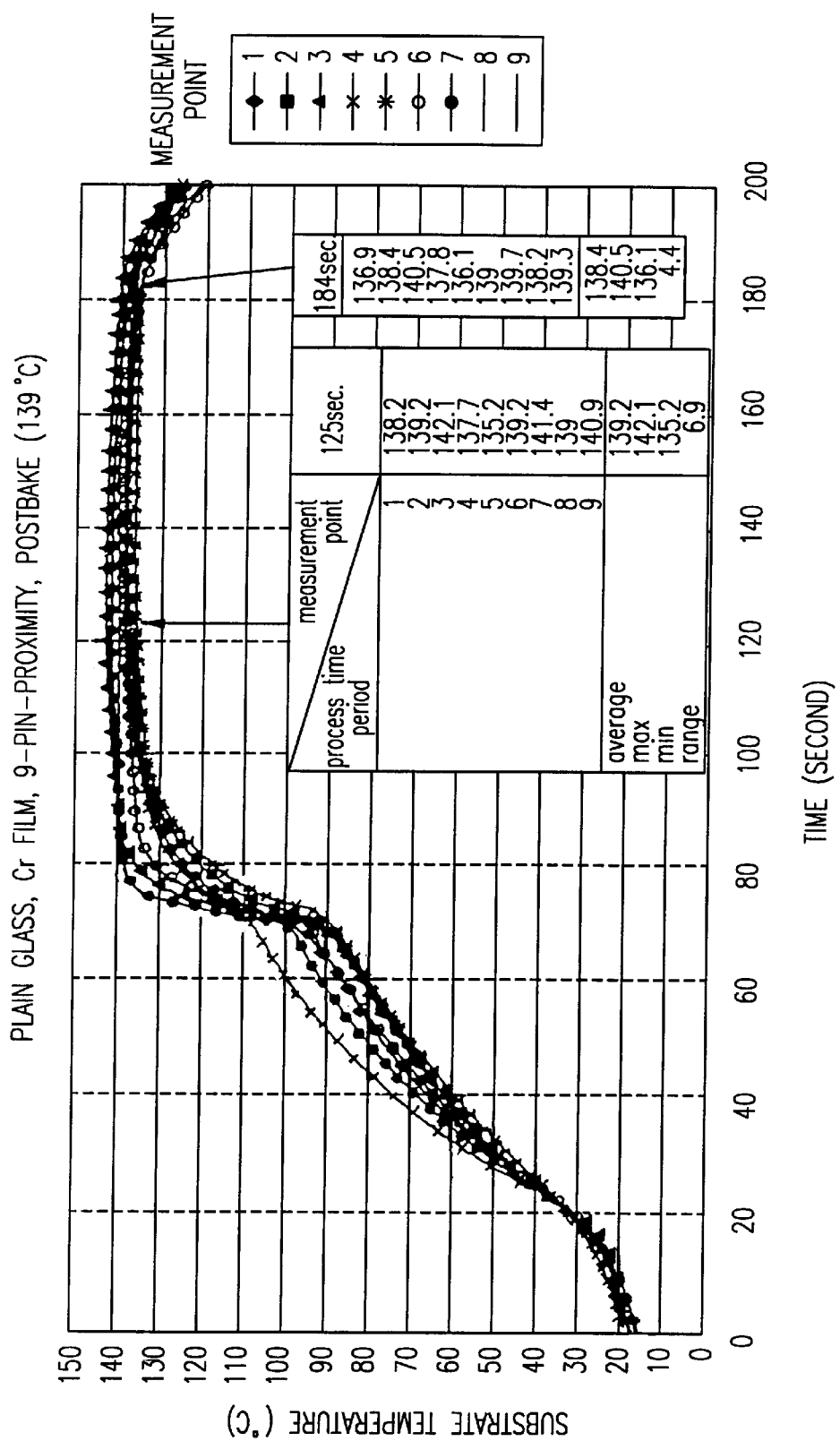
FIG. 15 is a graph showing a temperature rise curve of a substrate.
Figure 16:
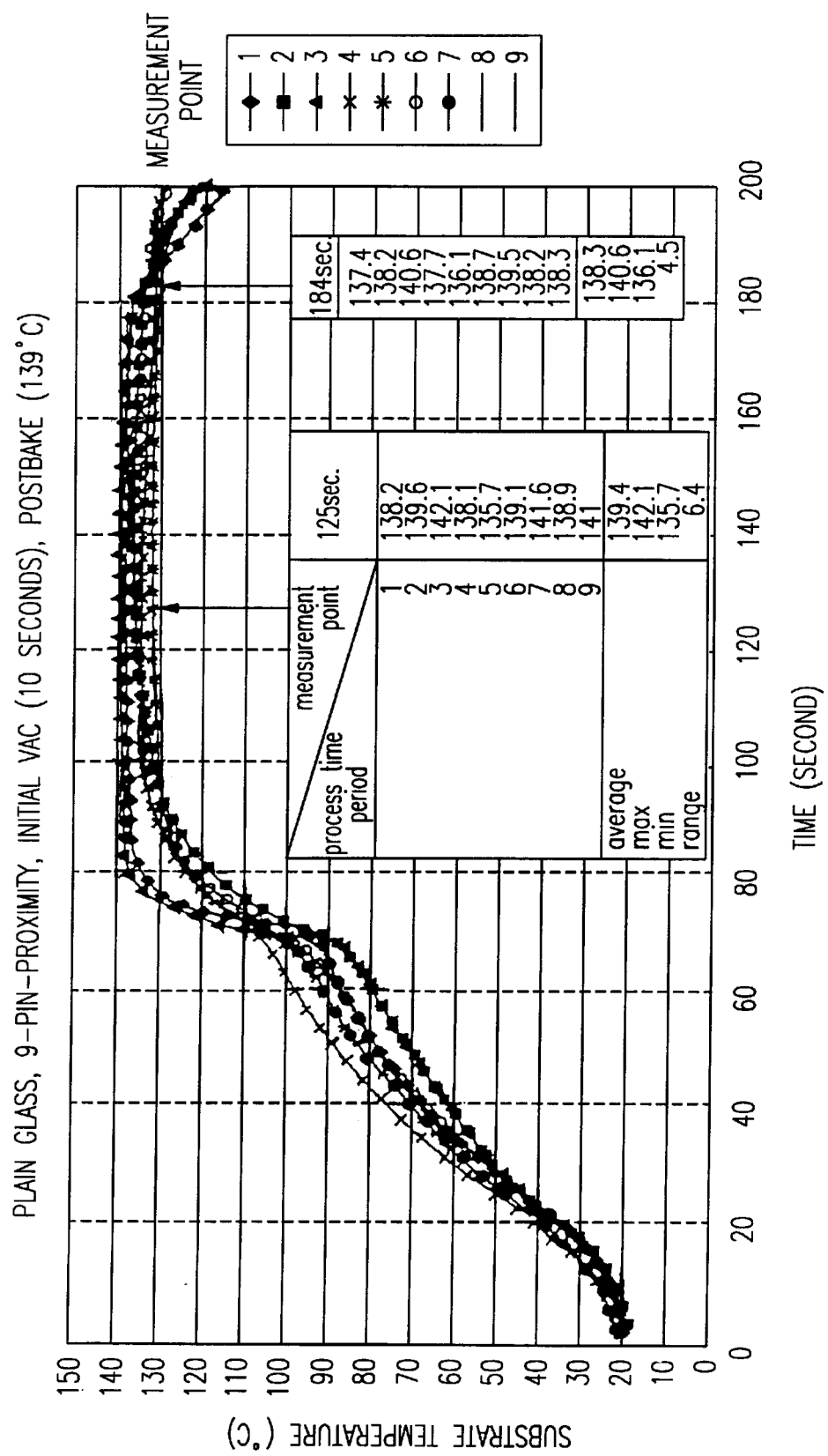
FIG. 16 is a graph showing a temperature rise curve of a substrate.

FIG. 15 is a graph showing a temperature rising curve of which the glass substrate was heated through the pins in the non-contact state. FIG. 16 is a graph showing a temperature rising curve of which the glass substrate was vacuum-sucked in the initial stage and then heated.

Figure 17:
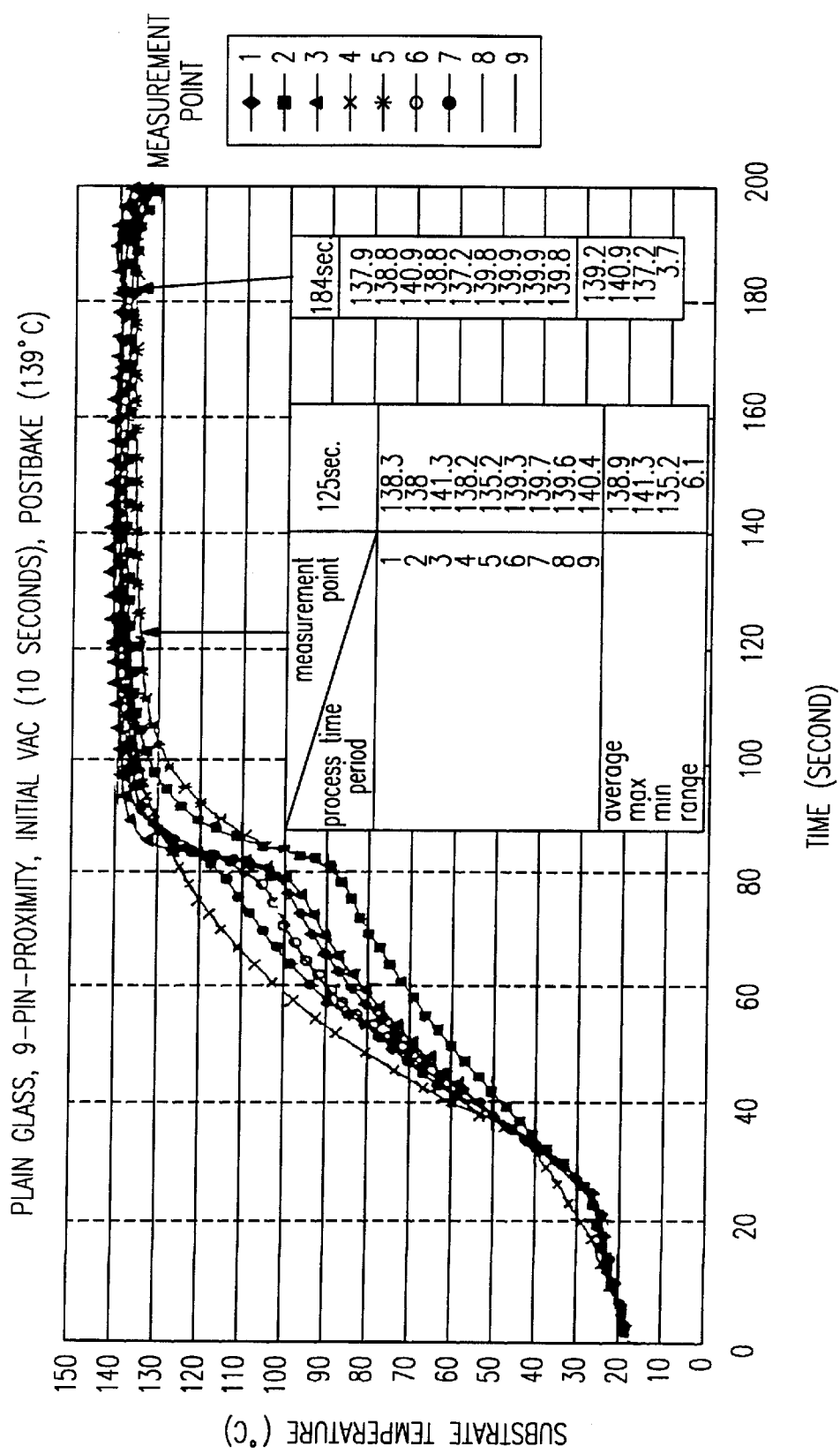
FIG. 17 is a graph showing a temperature rise curve of a substrate.
Figure 18:
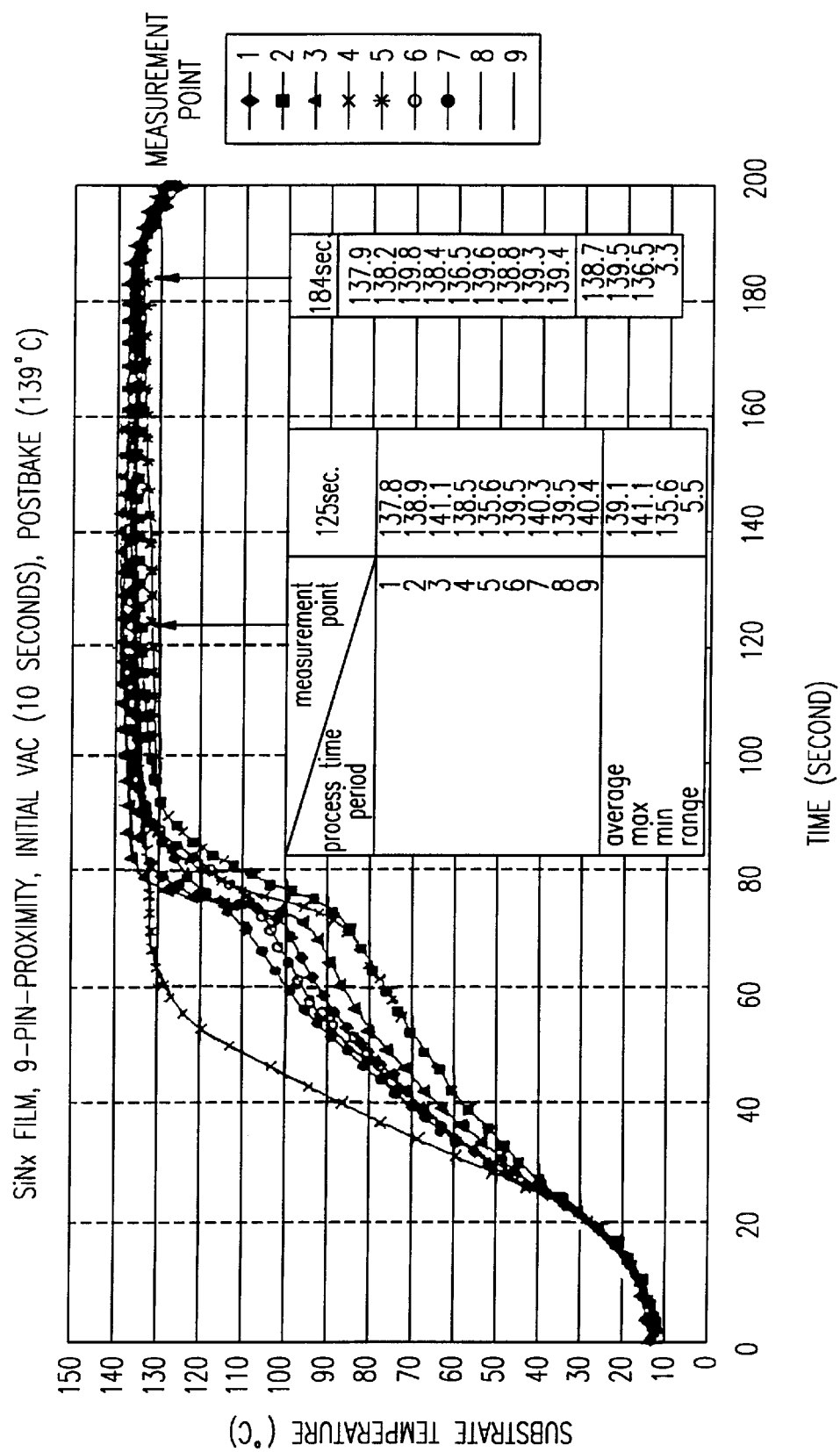
FIG. 18 a graph showing a temperature rise curve of a substrate.

FIG. 17 is a graph showing a temperature rising curve of which the substrate coated with the SiNx film was heated in a non-contact state. FIG. 18 is a graph showing a temperature rising curve of which the substrate coated with the SiNx film was vacuum-sucked in the initial stage and then heated.

FIG. 13 shows that the temperature of each measurement point gradually rose in 80 seconds to 140 seconds. FIG. 14 shows that the temperature of each measurement point rose to 130° C. or higher in 90 seconds and then was stable until 180 seconds. Thus, it is clear that the temperature rising velocity and temperature equality in the case that the vacuum sucking process is performed in the initial stage are superior to those in the case that the vacuum sucking process is not performed in the initial stage.

FIGS. 15 and 16 show that there are no substantial difference therebetween. Thus, it is clear that the case that the vacuum sucking process performed in the initial stage does not affect the glass substrate.

FIG. 17 shows that the temperature of each measurement point stopped rising in around 90 seconds and then gradually became stable until 120 seconds. FIG. 18 shows that the temperature of each measurement point stopped rising in around 80 seconds and then became stable in 90 seconds. Thus, it is clear that the temperature rising velocity and temperature equality in the case that the vacuum sucking process is performed in the initial stage are superior to those in the case that the vacuum sucking process is not performed in the initial stage.

Next, measurement results of static electricity charged on substrates are described.

Static electricity at a center point of the substrate coated with the Cr film was measured in atmospheric conditions of a temperature of 23.5° C. and a humidity of 59% with a surface potentiometer MODEL 70 (Hugle Company).

The static electricity of measurement samples placed on the heat process board having nine pins was measured in the following three methods. (1) The vacuum sucking process was performed at −9.2 kpa for 15 seconds in the initial stage of the heat process and then the charge removing process was performed. (2) The vacuum sucking process was performed at −9.2 kpa for 15 seconds in the initial stage of the heat process. (3) The vacuum sucking process was performed at −62.4 kpa in all the period of the heat process.

Figure 19:
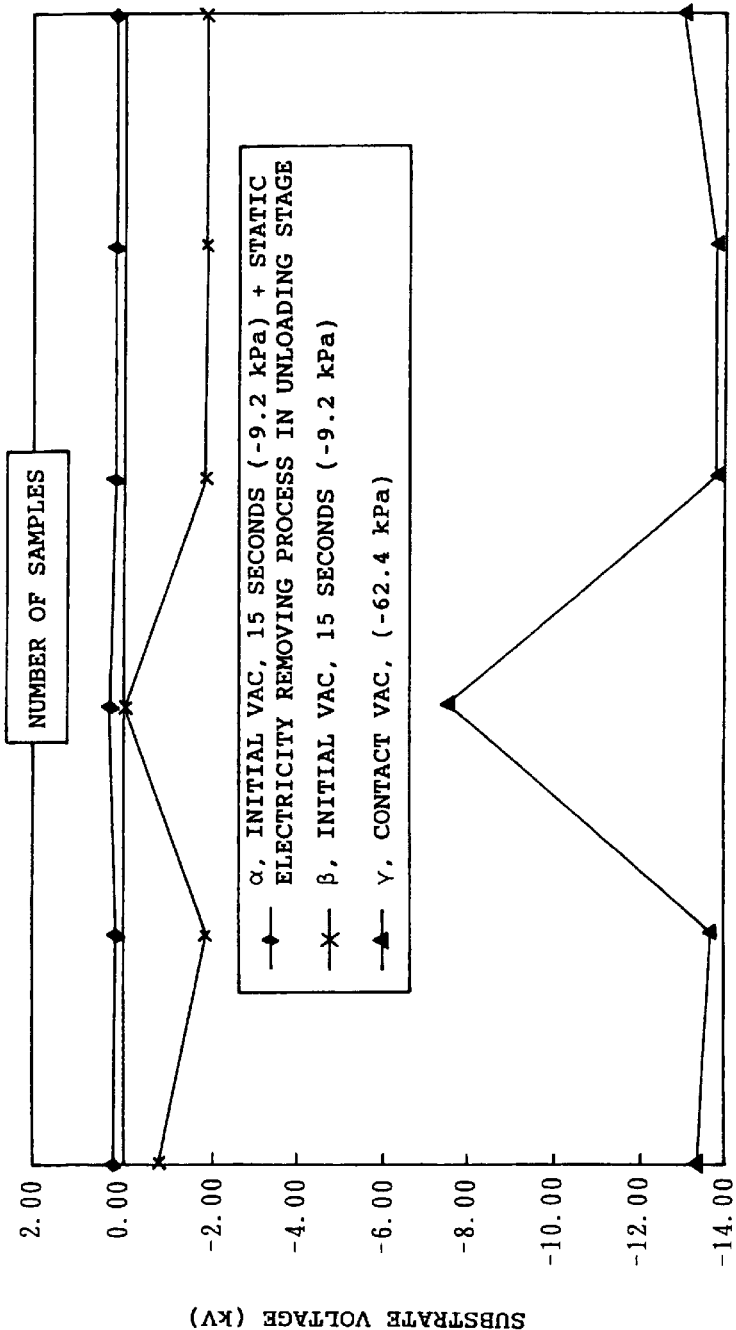
FIG. 19 is a graph showing a charging state of a substrate.

FIG. 19 is a graph showing substrate voltages after the static electricity of measurement samples have been measured in the above-described methods (1) to (3). As shown in FIG. 19, in the method (3) of which the heat process was performed in the state that the substrate contacted the heat process board, a substrate voltage frictionally charged was as high as −8 to −14 kv. on the other hand, in the methods (1) and (2) of which the vacuum sucking process was performed in the initial stage of the heat process, a substrate voltage was as low as 0 to −2 kV.

Next, a second embodiment of the present invention will be described. For simplicity, the description of redundant portions against the first embodiment will be omitted.

Figure 20:
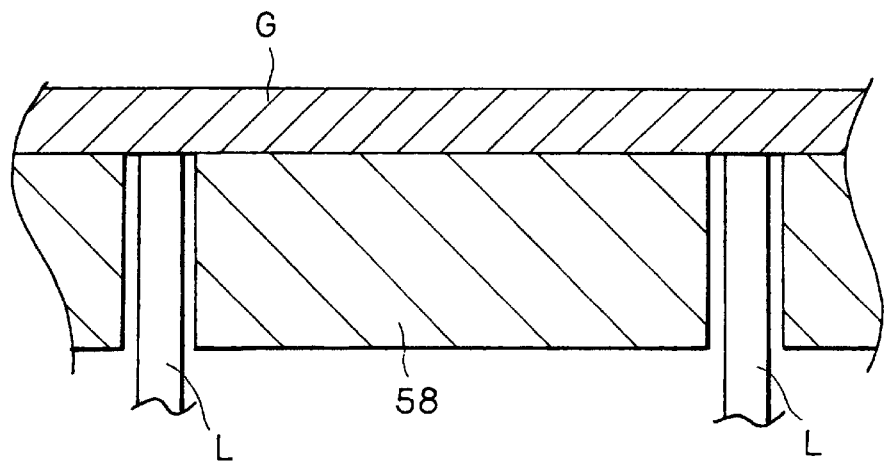
FIG. 20 is a vertical sectional view showing the structure of a heat process board according to a second embodiment of the present invention.
Figure 21:
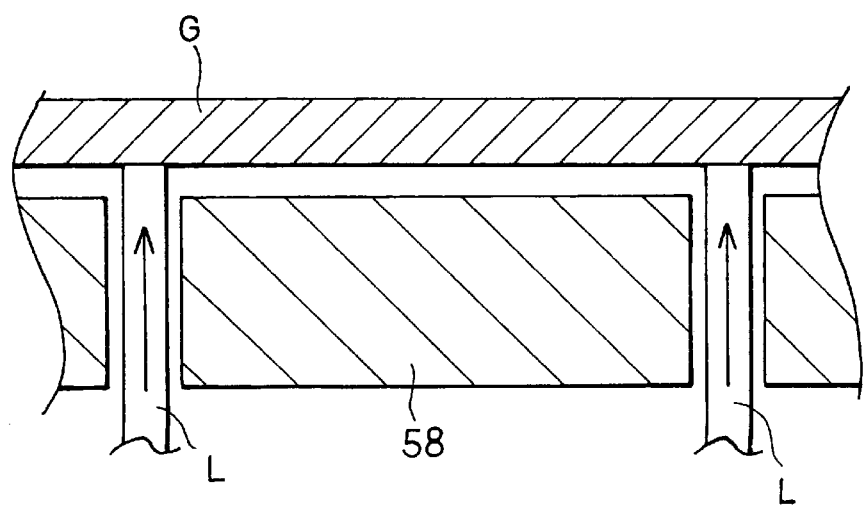
FIG. 21 is a vertical sectional view showing the structure of the heat process board according to the second embodiment of the present invention.

FIGS. 20 and 21 are enlarged vertical sectional views showing the state that a substrate G is placed on a heat process board 58 of a heat process unit according to the second embodiment of the present invention.

In the heat process unit according to the second embodiment, lifters L are disposed as a transferring means that causes the heat process board 58 that vertically moves via through-holes thereof to contact a substrate and to separate therefrom. When the lifters L are raised or lowered, the substrate G and the heat process board 58 are contacted or separated, respectively.

In other words, when the difference between the temperature of the substrate G and the process temperature is large, as shown in FIG. 20, the lifters L are placed at a position lower than the upper surface of the heat process board 58. After the temperature of the substrate G becomes almost the same as the process temperature, as shown in FIG. 21, the lifters L are raised so that the lifters L protrude from the upper surface of the heat process board 58 by for example 0.2 to 0.3 mm. Thus, the substrate G can be heat-processed quickly and equally. In addition, a static breakdown can be prevented in the substrate G.

In the heat process unit according to the second embodiment, since the lifters L are used, the substrate G and the heat process board 58 can be securely contacted and separated. In particular, since the contacting and separating time periods can be accurately controlled, the heat process can be accurately controlled. Moreover, since the substrate G is free from skewing, an excessive stress is not applied thereto. Thus, the quality of the substrate G does not deteriorate.

As the lifters L according to the second embodiment, with the lift pins 62, the substrate G and the heat process board 58 can be contacted and separated for a small distance.

Next, a third embodiment of the present invention will be described. For simplicity, the description of similar portions to those of the first embodiment and the second embodiment will be omitted.

Figure 22:
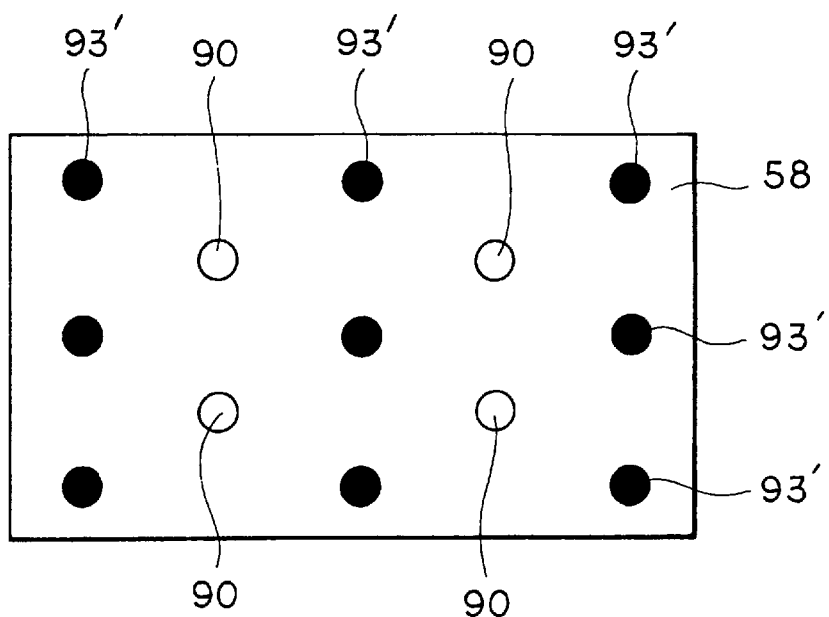
FIG. 22 is a plan view showing the structure of a heat process board according to a third embodiment of the present invention.
Figure 23:
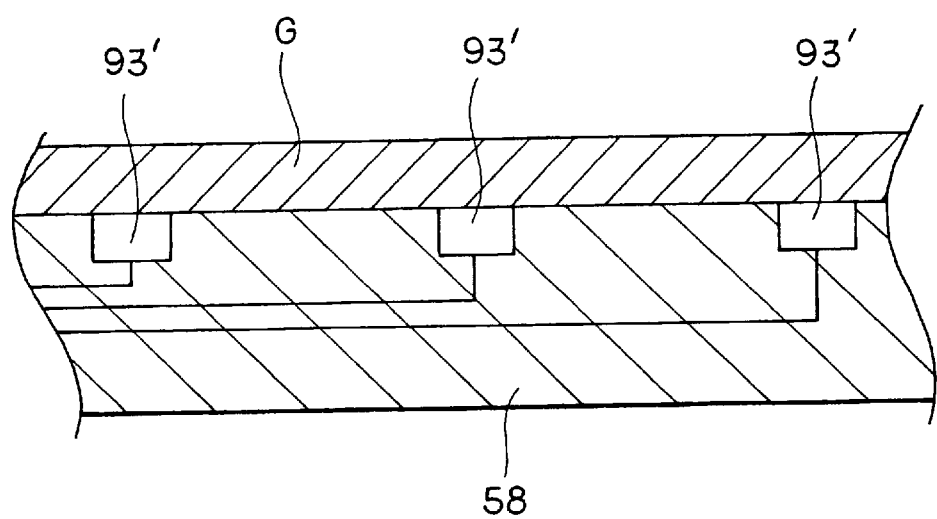
FIG. 23 is a vertical sectional view showing the structure of the heat process board according to the third embodiment of the present invention.
Figure 24:
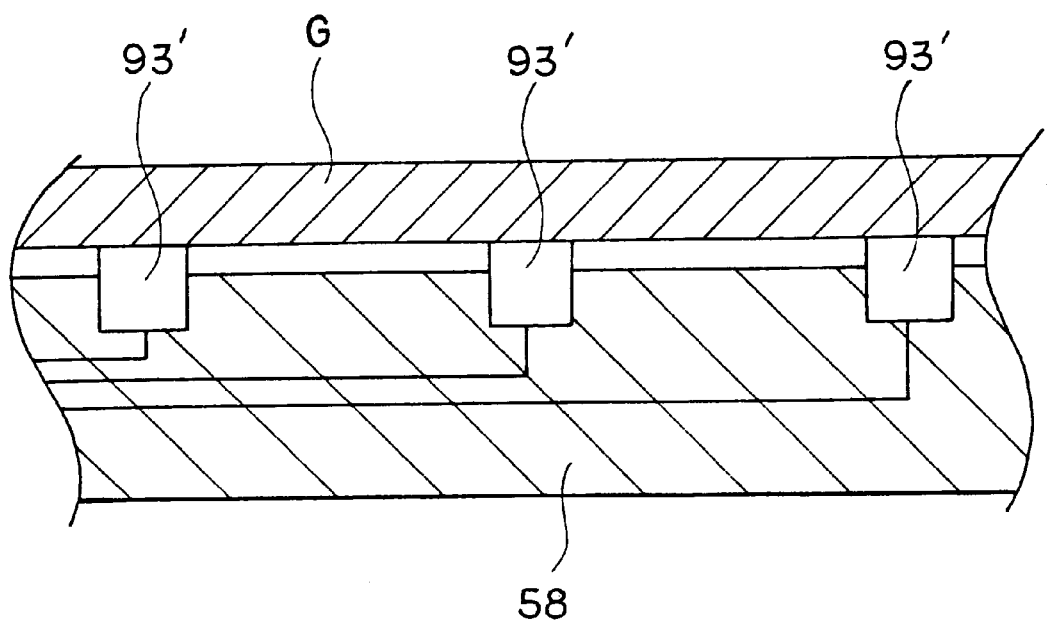
FIG. 24 is a vertical sectional view showing the structure of the heat process board according to the third embodiment of the present invention.

FIG. 22 is a plan view showing a heat process board 58 according to the third embodiment. FIGS. 23 and 24 are enlarged vertical sectional views showing the state that a substrate G is placed on the heat process unit according to the third embodiment.

In the heat process unit according to the third embodiment, cylindrical concave portions are formed at proper positions on the upper surface of the heat process board 58. The proper positions on the upper surface of the heat process board 58 are for example nine positions of the four corners of the substrate G, the center points of the individual sides thereof, and the intersection of the diagonal lines thereof. Cylindrically deformed pins 93' that are piezoelectric elements are disposed in the concave portions. An external drive voltage is supplied to the deformed pins 93'.

In the heat process unit according to the third embodiment, the deformed pins 93' are used instead of the lifters L according to the second embodiment. By applying a voltage to the deformed pins 93', the substrate G and the heat process board 58 are contacted and separated.

In other words, while the difference between the temperature of the substrate G and the process temperature is large (just after the heat process is started), as shown in FIG. 23, a voltage is not applied to the deformed pins 93'. Thus, in this state, the deformed pins 93' are placed at a position lower than the upper surface of the heat process board 58.

After the temperature of the substrate G becomes almost the same as the process temperature, as shown in FIG. 24, a voltage is applied to the deformed pins. Thus, the deformed pins 93' protrude from the upper surface of the heat process board 58 by for example 0.2 to 0.3 mm. Consequently, the substrate G can be heat-processed quickly and equally. In addition, a static breakdown of the substrate G can be prevented.

In the heat process unit according to the third embodiment, with the deformed pins 93' that are piezoelectric elements, the substrate G and the heat process board 58 can be securely contacted and separated. In particular, since the contacting and separating time periods are accurately controlled, the heat process can be accurately controlled. Moreover, since the substrate G is free from skewing, an excessive stress is not applied thereto. Thus, the quality of the substrate G does not deteriorate.

In addition, since the structure is simple, the fabrication cost is not largely increased.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A heat process apparatus, comprising:
   a heat process board for heating a substrate as a workpiece;
   a plurality of supporting members, disposed on a substrate mounting side of said heat process board, for supporting the substrate with a predetermined distance against said heat process board, wherein the distance between a peripheral portion of the substrate and said heat process board is larger than the distance between a center portion of the substrate and said heat process board; and sucking means, disposed in a non-supporting area of said supporting members, for sucking the substrate toward said heat process board.

2. The heat process apparatus as set forth in claim 1, wherein a sucking area of said sucking means against the substrate is composed of a plurality of areas and/or at least a part of a peripheral portion of the substrate.

3. The heat process apparatus as set forth in claim 1, wherein said plurality of supporting members are disposed at positions forming a rhombus shape connecting the center point of each side of the substrate placed on said heat process board and/or at positions of four corners and the center point of each side of the substrate placed on said heat process board.

4. The heat process apparatus as set forth in claim 3, wherein the distance between the substrate and said heat process board separated by said supporting members is in the range from 0.2 to 0.3 mm.

5. The heat process apparatus as set forth in claim 1, further comprising:

sucking amount adjusting means for adjusting the sucking amount of said sucking means, wherein said sucking amount adjusting means causes the substrate to contact said heat process board or separate from said heat process board by a predetermined distance.

6. The heat process apparatus as set forth in claim 1, wherein a predetermined voltage is applied to said plurality of supporting members.

7. A heat process apparatus, comprising:

a heat process board for heating a substrate as a workpiece, wherein the distance between a peripheral portion of the substrate and said heat process board is larger than the distance between a center portion of the substrate and said heat process board;

transferring means for supporting the substrate at a plurality of points so as to contact and/or separate said heat process board and the substrate; and sucking means for sucking the substrate toward said heat process board in the state that the substrate is being supported by said transferring means.

8. The heat process apparatus as set forth in claim 7, wherein a sucking area of said sucking means against the substrate is composed of a plurality of areas and/or at least a part of a peripheral portion of the substrate.

9. The heat process apparatus as set forth in claim 7, wherein said plurality of supporting members or transferring means are disposed at positions forming a rhombus shape connecting the center point of each side of the substrate placed on said heat process board and/or at positions of four corners and the center point of each side of the substrate placed on said heat process board.

10. The heat process apparatus as set forth in claim 9, wherein the distance between the substrate and said heat process board separated by said supporting members or said transferring means is in the range from 0.2 to 0.3 mm.

11. The heat process apparatus as set forth in claim 7, wherein a predetermined voltage is applied to said plurality of supporting members or transferring means.

12. A heat process method, comprising the steps of:

approaching a substrate as a workpiece to a heat process board in a predetermined distance; and causing the distance between a peripheral portion of the substrate and a heat process board to be larger than the distance between a center portion of the substrate and the heat process board, causing the substrate to be unevenly deformed against the heat process board, causing the substrate to partly contact the heat process board, or causing the distance between the substrate and the heat process board to be at least partly varied so as to heat-process the substrate.

13. The heat process method as set forth in claim 12, further comprising the step of:

causing the distance between the substrate and the heat process board to be substantially increased as a pre-heat process.

14. The heat process method as set forth in claim 12, further comprising the step of:

removing static electricity from the substrate before the heat process is performed, while the heat process is being performed, or after the heat process is performed.

15. A heat process apparatus, comprising:

a heat process board for heating a substrate as a workpiece;

transferring means for supporting the substrate at a plurality of points so as to contact and/or separate said heat process board and the substrate;

sucking means for sucking the substrate toward said heat process board in the state that the substrate is being supported by said transferring means;

sucking amount adjusting means for adjusting the sucking amount of said sucking means, wherein said sucking amount adjusting means causes the substrate to contact said heat process board or separate from said heat process board by a predetermined distance.

* * * * *